US009065179B2

(12) United States Patent
Kimura et al.

(10) Patent No.: US 9,065,179 B2
(45) Date of Patent: Jun. 23, 2015

(54) ELECTRICAL CONDUCTIVE MEMBER AND ELECTRICAL CONDUCTIVE MEMBER ASSEMBLY

(75) Inventors: Takeshi Kimura, Kanagawa (JP); Shinichi Hashimoto, Kanagawa (JP)

(73) Assignee: Tyco Electronics Japan G.K., Kanagawa-ken (JP)

( * ) Notice: Subject to any disclaimer, the term of this patent is extended or adjusted under 35 U.S.C. 154(b) by 228 days.

(21) Appl. No.: 13/618,560

(22) Filed: Sep. 14, 2012

(65) Prior Publication Data

US 2013/0062109 A1 Mar. 14, 2013

(30) Foreign Application Priority Data

Sep. 14, 2011 (JP) ................................ 2011-200886
Apr. 27, 2012 (JP) ................................ 2012-103642

(51) Int. Cl.

*H05K 1/02* (2006.01)
*H05K 1/16* (2006.01)
*H01Q 1/36* (2006.01)
*H01Q 1/24* (2006.01)
*H01Q 1/38* (2006.01)
*H01Q 21/28* (2006.01)

(52) U.S. Cl.

CPC ................ *H01Q 1/36* (2013.01); *H01Q 1/243* (2013.01); *H01Q 1/38* (2013.01); *H01Q 21/28* (2013.01)

(58) Field of Classification Search

CPC ........... H01Q 21/00; B32B 1/00; H05K 7/00; H05K 5/00
USPC ........................................................ 174/250
See application file for complete search history.

(56) References Cited

U.S. PATENT DOCUMENTS

| | | | | |
|---|---|---|---|---|
| 5,972,447 | A | 10/1999 | Hata et al. | |
| 6,396,444 | B1 | 5/2002 | Goward et al. | |
| 6,456,249 | B1 | 9/2002 | Johnson et al. | |
| 6,531,983 | B1 | 3/2003 | Hirose et al. | |
| 6,603,432 | B2 | 8/2003 | Hill et al. | |
| 6,778,139 | B2 | 8/2004 | Suzuki et al. | |
| 7,868,832 | B2 | 1/2011 | Krishtul | |
| 8,680,402 | B2 * | 3/2014 | An et al. | 174/254 |
| 2004/0137950 | A1 | 7/2004 | Bolin et al. | |
| 2006/0001576 | A1 * | 1/2006 | Contopanagos | 343/702 |
| 2009/0067141 | A1 * | 3/2009 | Dabov et al. | 361/753 |
| 2009/0108985 | A1 | 4/2009 | Haag et al. | |
| 2009/0229108 | A1 | 9/2009 | Shamblin et al. | |
| 2009/0231206 | A1 | 9/2009 | Shamblin et al. | |

FOREIGN PATENT DOCUMENTS

| | | | |
|---|---|---|---|
| EP | 1937039 A1 | | 6/2008 |
| JP | 2007-274665 | | 10/2007 |
| WO | 2010123733 A1 | | 10/2010 |
| WO | WO 2011000416 A1 | * | 1/2011 |

* cited by examiner

*Primary Examiner* — Timothy Thompson
*Assistant Examiner* — Michael F McAllister
(74) *Attorney, Agent, or Firm* — Barley Snyder

(57) ABSTRACT

An electrical conductive member is provided with a base layer and a conductor. The base layer includes a first portion, a second portion extending at an angle relative to the first portion, and a curved portion connecting the first portion and the second portion. The conductor is arranged on a portion of the base layer.

40 Claims, 26 Drawing Sheets

ELECTRICAL CONDUCTIVE MEMBER AND ELECTRICAL CONDUCTIVE MEMBER ASSEMBLY

CROSS-REFERENCE TO RELATED APPLICATION

This application claims the benefit of the filing date under 35 U.S.C. §119(a)-(d) of JP Patent Application No. 2011-200886 of Sep. 14, 2011 and JP Patent Application No. 2012-103642 of Apr. 27, 2012.

FIELD OF THE INVENTION

The invention relates to an electrical conductive member and, in particular, to an electrical conductive member and an electrical conductive member assembly.

BACKGROUND

Electrical equipment, for example, mobile communication equipment such as mobile phones, generally have an antenna embedded therein for wireless communication.

As such an antenna device, such as the antenna device shown in FIG. 36, for example, is known (See JP 2007-274665 A).

The known antenna device 101 shown in FIG. 36 includes a base body 110 made of a synthetic resin and a known flexible printed circuit board (FPC) 120.

Herein, a first element 121 and a second element 122 each made of an electrical conductive pattern, such as a copper foil, are independently disposed on one surface of the base of the known FPC 120 (that is the surface to be attached to the base body 110). Moreover, the known FPC 120 includes a folded portion 123 which is to be arranged along a side surface position of the base body 110. A power-feeding portion, not shown, includes the folded portion 123, and an end of the power-feeding portion is connected to the second element 122. Moreover, chips 124 and 125 constituting a resonant circuit are disposed between the first element 121 and the second element 122.

A surface of the known FPC 120, on which the first element 121 and the second element 122 and the chips 124 and 125 (constituting an antenna element) are formed, is attached to a top surface 111 of the base body 110 using double-sided tape, or other securing means known to the art.

Meanwhile, an antenna device used in mobile communication equipment, such as a mobile phone, should be arranged apart from electrical conductive members, such as a circuit board embedded in the communication equipment, in order to more efficiently carry out wireless communications. Therefore, in recent years, there is a demand for arranging the antenna device in a chassis, such as a cover of the mobile communication equipment, such that the antenna device is positioned apart from the embedded circuit board. When the chassis is rectangular shaped, corners of the chassis are disposed furthest from the embedded circuit board. Therefore, it is most preferable to arrange the antenna device at a corner of the chassis. On the other hand, the corners of the chassis, such as a cover, often tend to have a curved section made of a three-dimensional curved surface.

Herein, a “three-dimensional curved surface” denotes a surface having a curved line in all planes: X-Y plane; Y-Z plane; and Z-X plane, when an object is projected onto all of them, assuming that there are X, Y, and Z axes crossing perpendicular to one another.

However, there are problems positioning the known FPC 120 shown in FIG. 36 along a curved section of a chassis having a three-dimensional curved surface.

That is, since the known FPC 120 is a tabular film member having a flat plate shape, it cannot be arranged smoothly along the curved section having the three-dimensional curved surface of the chassis. In other words, when the known FPC 120, which is a film member having a flat plate shape, is curved and then arranged along the curved section having the three-dimensional curved surface, wrinkles or distortions may occur.

On the other hand, in recent years, antennas formed by resin injection molding, each having a conductor on its surface, such as a Molded Interconnect Device (MID) antenna or a Laser Direct Structuring (LDS) antenna, have also been developed. Since the base material of the MID antenna or the LDS antenna is formed using injection molding techniques or the like, a degree of freedom in three-dimensional shape is relatively high, and therefore it is also possible to arrange it along the curved section having a three-dimensional curved surface of the chassis.

However, in the MID or the LDS antenna, since resin is injected into a mold, a certain thickness (MID antenna: approximately 1 mm, LDS antenna: approximately 0.5 mm) is needed, which does not meet the demand for downsizing.

SUMMARY

Accordingly, the invention has been made to solve the above-mentioned problem, and an electrical conductive member is provided. The electrical conductive member has a base layer and a conductor. The base layer includes a first portion, a second portion extending at an angle relative to the first portion, and a curved portion connecting the first portion and the second portion. The conductor is arranged on a portion of the base layer.

BRIEF DESCRIPTION OF THE DRAWINGS

The features and advantages of the invention should become apparent from the following description when taken in conjunction with the accompanying drawings, in which.

DETAILED DESCRIPTION OF THE EMBODIMENT(S)

A exemplary embodiment of an electrical conductive member, according to the invention, will be described below with reference to FIGS. 1 to 12.

Figure 1:
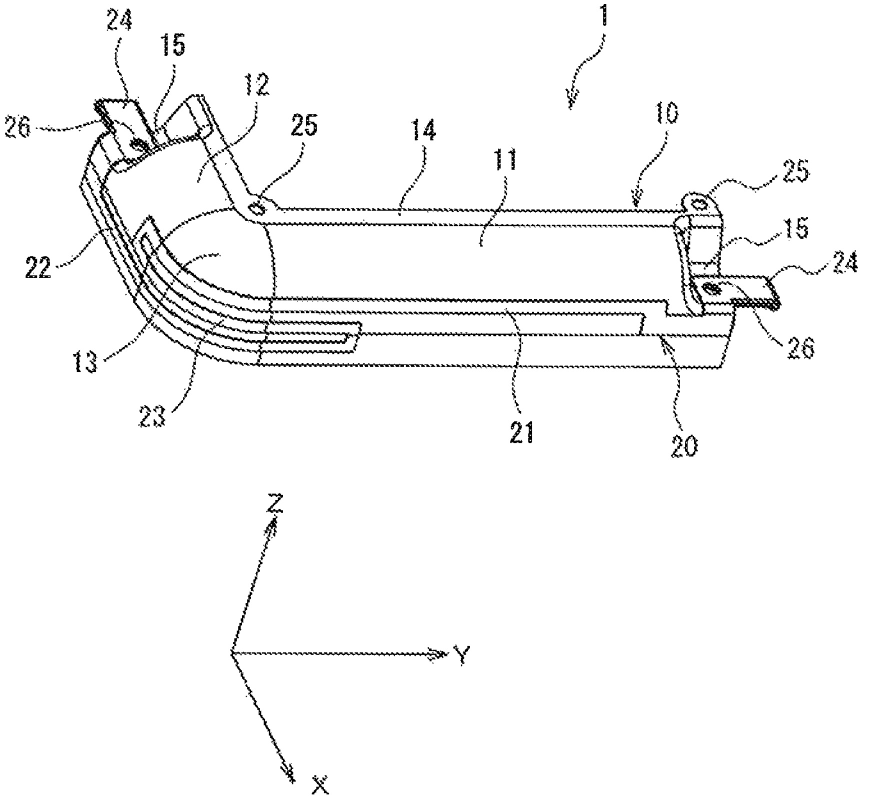
FIG. 1 is a perspective view of an electrical conductive member according to the invention.

The electrical conductive member 1, as shown in FIG. 1, is used as an antenna device for a mobile phone, and arranged in a chassis 30 of the mobile phone, as shown in FIG. 6A to FIG. 12.

The electrical conductive member 1 includes a base layer 10 and a conductor 20.

Figure 2A:
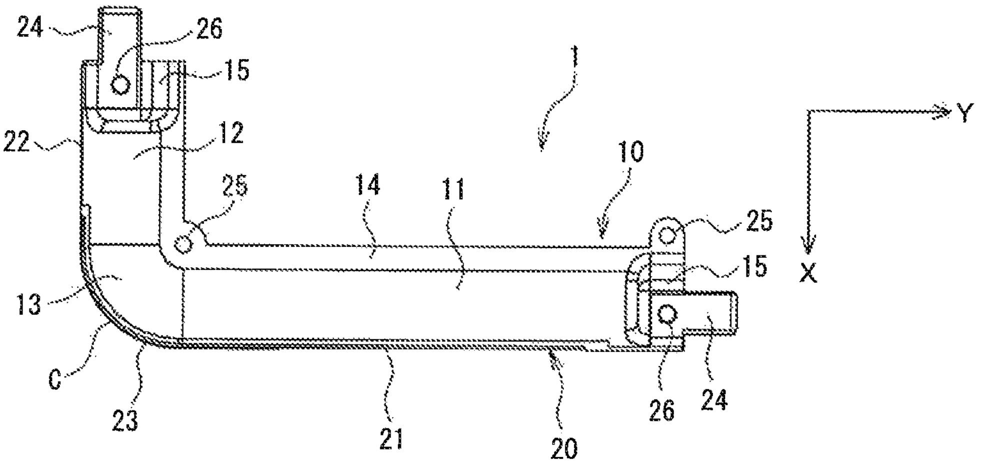
FIG. 2A is a plan view of the electrical conductive member shown in FIG. 1.
Figure 2B:
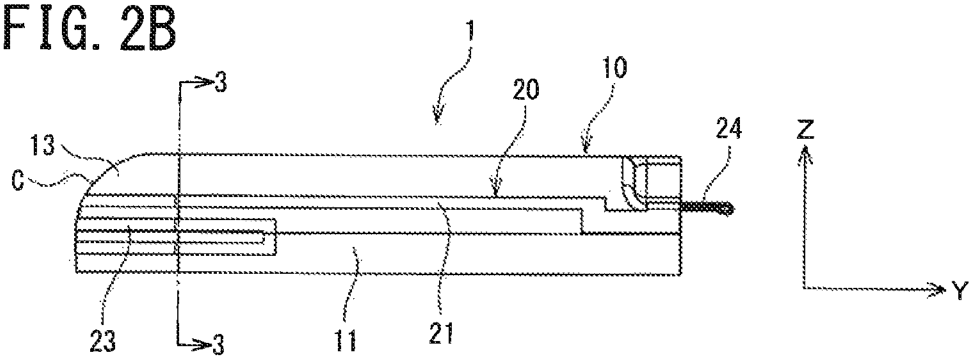
FIG. 2B is a front view of the electrical conductive member shown in FIG. 1.

The base layer 10 includes a first portion 11 extending in a Y axial direction and a second portion 12 extending at an angle, in the example shown, substantially orthogonal to the first portion 11 in an X axial direction, assuming that there are X, Y, and Z axes intersecting one another perpendicularly, as shown in FIG. 1. A curved portion 13, which connects the first portion 11 and the second portion 12, is formed at a corner in the embodiment shown, at which the first portion 11 intersects with the second portion 12. As shown in FIG. 2A, the base layer 10 is substantially L-shaped, when viewed from above. The base layer 10 is manufactured from an insulating synthetic resin, such as polycarbonate or ABS.

The first portion 11 includes a portion having a substantially uniform thickness t2 (see FIG. 3), with a top side (surface shown in FIG. 1) and a bottom side (surface shown in FIG. 5), each having a one-dimensional curved surface, extending in the Y axial direction. In the embodiment shown, the thickness t2 of the substantially uniform thick portion of the first portion 11 is approximately 0.1 to 1 mm, to be specific. Herein, "one-dimensional curved surface" denotes a surface having a curved line in only one of planes: X-Y plane; Y-Z plane; and Z-X plane, when the first portion 11 is projected onto all of the planes in FIG. 1. The first portion 11 curves such that the top side has a convex shape from the upper end in the Z axial direction, and then reaches the lower end in the Z axial direction. It is to be noted that the top side of this first portion 11 is formed along the inner surface of an end wall portion 33 (described later) of the chassis 30 in which the first portion 11 is provided, in such a form that allows the electrical conductive member 1 to be positioned with respect to the chassis 30. Therefore, the top side of the first portion 11 may not necessarily include a one-dimensional curved surface as long as it is shaped to have a positioning function. Moreover, the bottom side of the first portion 11 does not necessarily include a one-dimensional curved surface.

Moreover, the second portion 12 includes a substantially uniform thick portion, defined by the top side (surface shown in FIG. 1) and a bottom side (surface shown in FIG. 5), each having a one-dimensional curved surface, extending in the X axial direction. The thickness of the substantially uniform thick portion of the second portion 12 is equal to the thickness t2 of the first portion 11. Length of the second portion 12 extending in the X axial direction is shorter than that of the first portion 11 extending in the Y axial direction. The second portion 12 curves such that the top side has a convex shape from the upper end in the Z axial direction, and then reaches the lower end in the Z axial direction. It is to be noted that the top side of the second portion 12 is formed, along the inner surface of a side wall portion 32 (described later) of the chassis 30 in which the second portion 12 is provided, in such a form that allows the electrical conductive member 1 to be positioned with respect to the chassis 30. Therefore, the top side of the second portion 12 may not necessarily include a one-dimensional curved surface as long as it is shaped to have a positioning function. Moreover, the bottom side of the second portion 12 does not necessarily include a one-dimensional curved surface.

Moreover, the curved portion 13 connects one end (left end in FIG. 2A) of the first portion 11 (lower end in FIG. 2A) to the second portion 12. The curved portion 13 includes a portion having a substantially uniform thickness t1 (see FIG. 3) with a top side (surface shown in FIG. 1) and a bottom side (surface shown in FIG. 5). Thickness t1 of the curved portion 13 is approximately 30 to 90% of the thickness t2. Herein, the "three-dimensional curved surface" denotes a surface having a continuously curved line in all planes: X-Y plane; Y-Z plane, and Z-X plane, when the curved portion 13 is projected onto all of them, supposing there are X, Y, and Z axes crossing perpendicular to one another. When the curved portion 13 is projected onto the X-Y plane, a curved line c is formed in the X-Y plane, as shown in the plan view of FIG. 2A. Moreover, when the curved portion 13 is projected onto the Y-Z plane, the curved line c is formed in the Y-Z plane, as shown in the front view of FIG. 2B.

Figure 2C:
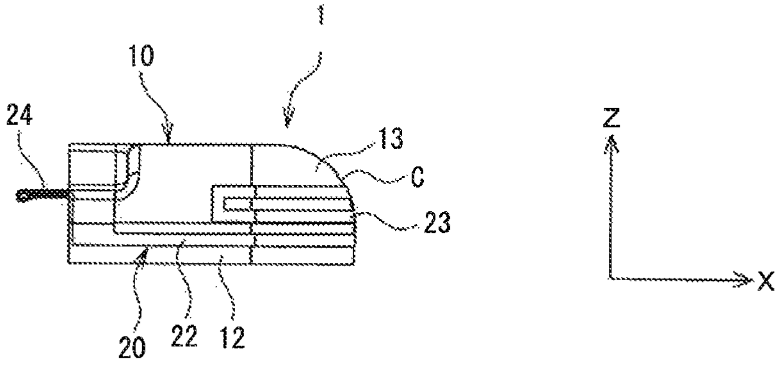
FIG. 2C is a left side view of the electrical conductive member shown in FIG. 1.
Figure 2D:
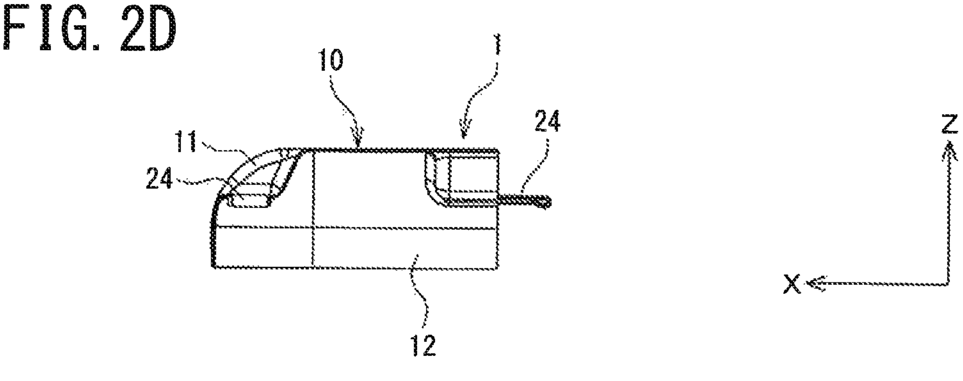
FIG. 2D is a right side view of the electrical conductive member shown in FIG. 1.
Figure 3:
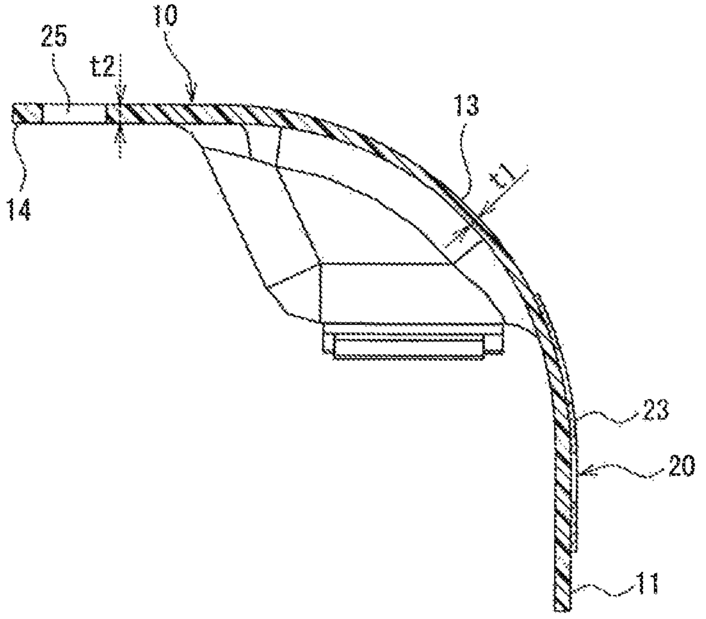
FIG. 3 is a cross-sectional view taken along line 3-3 in FIG. 2B.
Figure 4A:
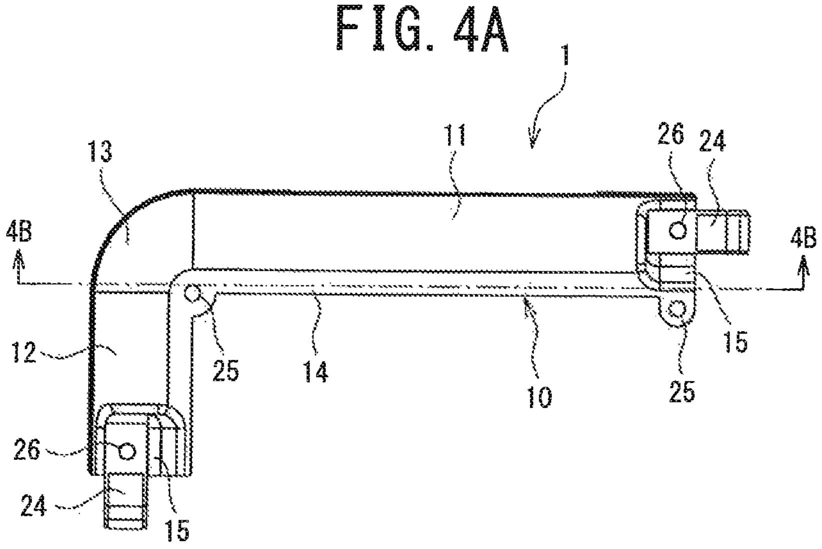
FIG. 4A is a bottom view of the electrical conductive member of FIG. 1.
Figure 4B:
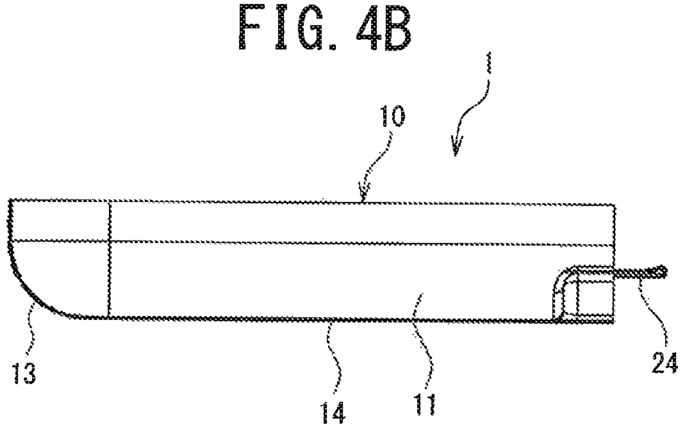
FIG. 4B is a cross-sectional view taken along line 4B-4B in FIG. 4A.
Figure 5:
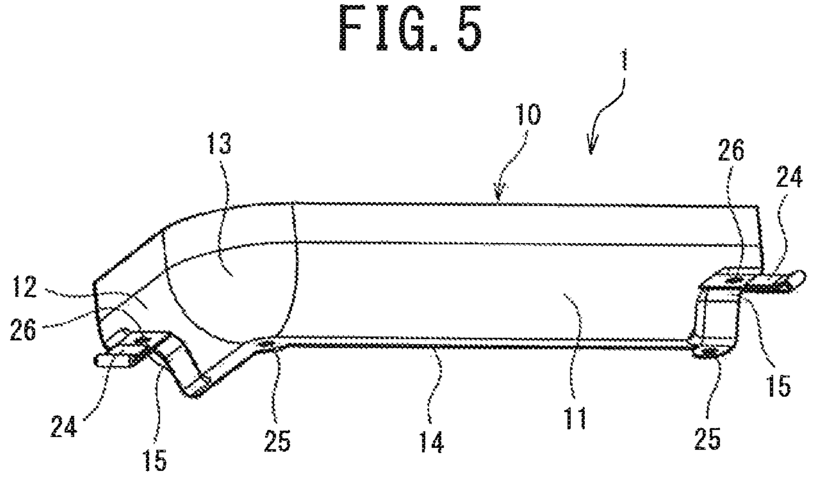
FIG. 5 is a perspective view of electrical conductive member of FIG. 1, when showing a bottom side of the electrical conductive member.

Moreover, when the curved portion 13 is projected onto the Z-X plane, as shown in the left side view of FIG. 2C, the curved line C is formed in the Z-X plane. It is to be noted that a top side of the curved portion 13 includes a three-dimensional curved surface extending along the inner surface of a curved section 34 (described later) in the chassis 30 in which the curved portion 13 is arranged. On the other hand, a bottom side of the curved portion 13 does not necessarily include a three-dimensional curved surface. Moreover, as shown in FIG. 3, thickness t1 of the curved portion 13 is thinner than the rest of the base layer 10. To be specific, the curved portion is thinner than thickness t2 of the first portion 11, thickness of the second portion 12, and thickness t2 of an extending portion 14, to be described later, respectively.

The base layer 10 includes the extending portion 14, which extends inward from upper ends of the first portion 11, the second portion 12, and the curved portion 13 in the Z axial direction. The extending portion 14 is formed in a substantially L-shape when viewed from above. Thickness of the extending portion 14 is equal to the thickness t2 of the first portion 11, as shown in FIG. 3. Two projection receiving passageways 25, into which respective projections 35 (disposed on the chassis 30) enter, are disposed at one end of the extending portion 14 in the Y axial direction and at another end of the extending portion 14 in the Y axial direction (right end in FIG. 2A), respectively. The projections 35 of the chassis 30 enter these projection receiving passageways 25 and then deformed therein, thereby securing the base layer 10 to the chassis 30.

Moreover, as shown in FIG. 1, a recess 15, which extends from the top side to the bottom side, is disposed at the other end of the first portion 11 of the base layer 10 in the Y axial direction, while another recess 15, which extends from the top side to the bottom side, is formed at the other end of the second portion 12 in the X axial direction.

Figure 11:
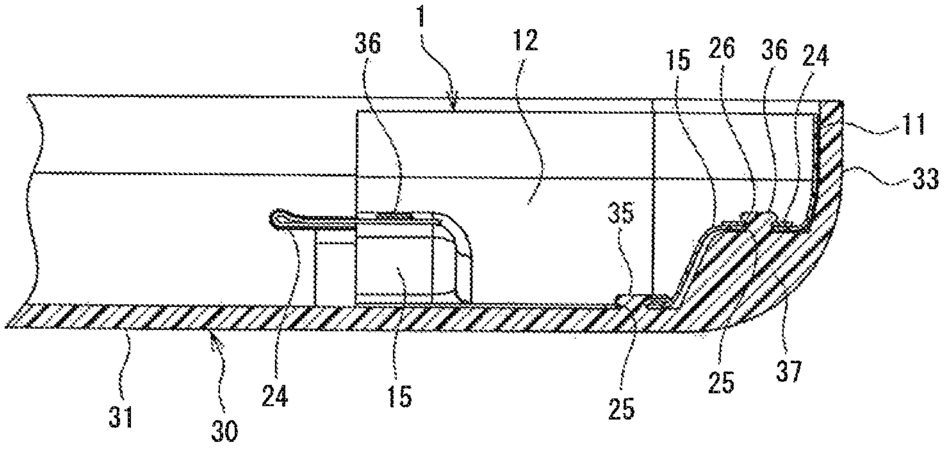
FIG. 11 is an enlarged view of a portion indicated by an arrow 11 in FIG. 8.

As shown in FIG. 11, the projection receiving passageway 25, into which a projection 36 disposed along a stand 37 of the chassis 30 enters, is formed in each recess 15. The securing portion according to the invention includes the projection receiving passageway 25 formed in the extending portion 14 and the projection receiving passageway 25 formed in the recess 15.

Next, as shown in FIG. 1, the conductor 20 is positioned on a portion of the top side of the base layer 10, and includes a first conductive portion 21, a second conductive portion 22, and a third conductive portion 23. The first conductive portion 21 includes a planate electrical conductive pattern extending towards one end of the first portion 11 from the other end thereof (right end in FIG. 2A) in the Y axial direction. The second conductive portion 22 includes a planate electrical conductive pattern extending towards one end the second portion 12 from the other end thereof (upper end in FIG. 2A) in the X axial direction. The third conductive portion 23 includes a planate electrical conductive pattern extending from one end of the first conductive portion 21 to one end of the second conductive portion 22 and positioned on the surface of the curved portion 13. In the embodiment shown, the third conductive portion 23 is trice folded over.

Herein, as shown in FIG. 1, FIG. 2A, FIG. 2B, FIG. 2C, FIG. 2D, FIG. 4A, FIG. 4B, and FIG. 5, a power-feeding portion 24 is disposed at the other end portion of the first conductive portion 21 of the conductor 20 in the Y axial direction and another power-feeding portion 24 is disposed at the other end portion of the second conductive portion 22 in the X axial direction, respectively. The power-feeding portion 24 on the first conductive portion 21 side is formed by bending the first conductive portion 21 towards the recess 15 from the other end portion of the first conductive portion 21, and then folding back the first conductive portion 21 by 180 degrees from the end of the top side thereof to the bottom side. On the other hand, the power-feeding portion 24 on the second conductive portion 22 side is formed by bending the second conductive portion 22 towards the recess 15 from the other end portion of the second conductive portion 22, and then folding back the second conductive portion 22 by 180 degrees from the end of the top side thereof to the bottom side. A projection receiving passageway 26 is formed in each power-feeding portion 24 to correspond to the projection receiving passageway 25 formed in the recess 15.

A manufacturing method for the electrical conductive member 1 will be described next. First of all, the base layer 10 formed in a tabular form is prepared. Next, the conductor 20 made of an electrical conductive pattern in the aforementioned shape is printed on the surface of the base layer 10. The base layer 10 on which a pattern of the conductor 20 is printed is formed by vacuum forming. In this manner, manufacturing of the electrical conductive member 1 is completed.

As shown in FIG. 6A to FIG. 12, the electrical conductive member 1 manufactured in this way is arranged in the chassis 30 of the mobile phone, which is an assembled component, so that an electrical conductive member assembly 40 is configured.

An arrangement of the electrical conductive member 1 according to an aspect of the invention will be described in detail.

Firstly, the chassis 30 on which the electrical conductive member 1 is arranged will be described. As shown in FIG. 6A to FIG. 9, the chassis 30 includes a flat surface portion 31 having a rectangular shape, a pair of side wall portions 32, and a pair of end wall portions 33. The pair of side wall portions 32 extend up (in the Z axial direction) from both side edges of the flat surface portion 31 in the width direction (in the Y axial direction). A pair of end wall portions 33 extend up (in the Z axial direction) from both ends of the flat surface portion 31 in the length direction (in the X axial direction). The curved section 34 is formed at corners where each side wall portion 32 and each end wall portion 33 intersect with each other.

Figure 9:
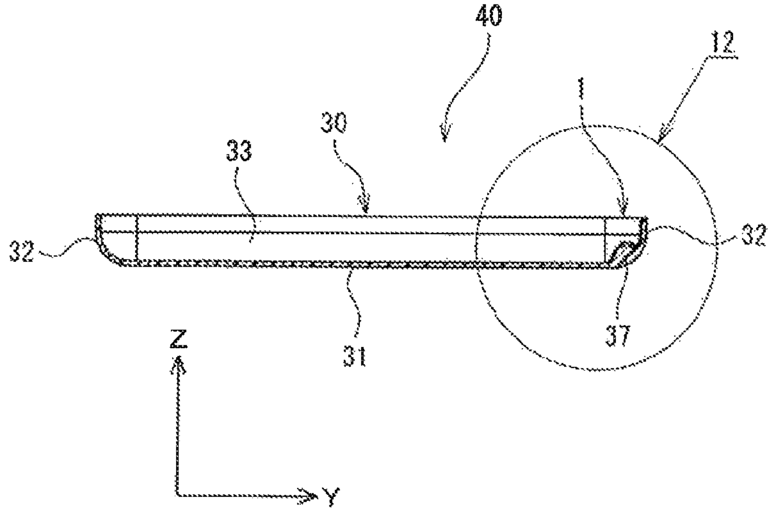
FIG. 9 is a cross-sectional view taken along line 9-9 in FIG. 7.
Figure 10:
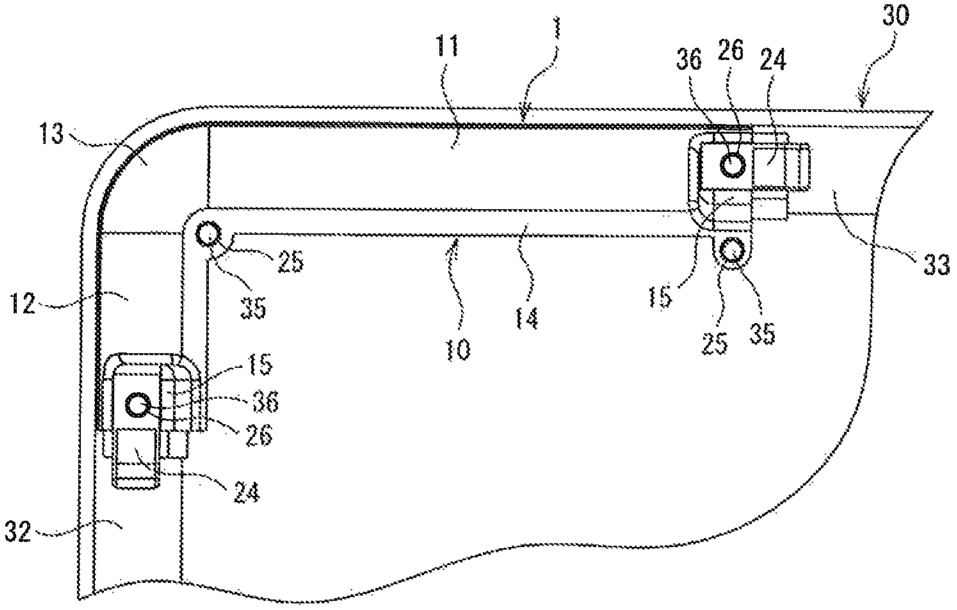
FIG. 10 is an enlarged view of a portion indicated by an arrow 10 in FIG. 7.

Herein, as shown in FIG. 9, each side wall portion 32 has a substantially uniform thickness and has an inner surface (surface on the flat surface portion 31 side in FIG. 9) and an outer surface (outer surface from the flat surface portion 31 in FIG. 9), each of which includes a one-dimensional curved surface. Herein, "one-dimensional curved surface" denotes a surface having a curved line in only one of the planes: X-Y plane; Y-Z plane; and Z-X plane, as shown in FIG. 7, when the side wall portion 32 is projected onto all of the planes in FIG. 6A. Each side wall portion 32 curves and then extends such that an outer region from the side edges of the first surface portions 31 in the width direction has a convex shape, and then extends in the X axial direction, as shown in FIG. 7.

Figure 7:
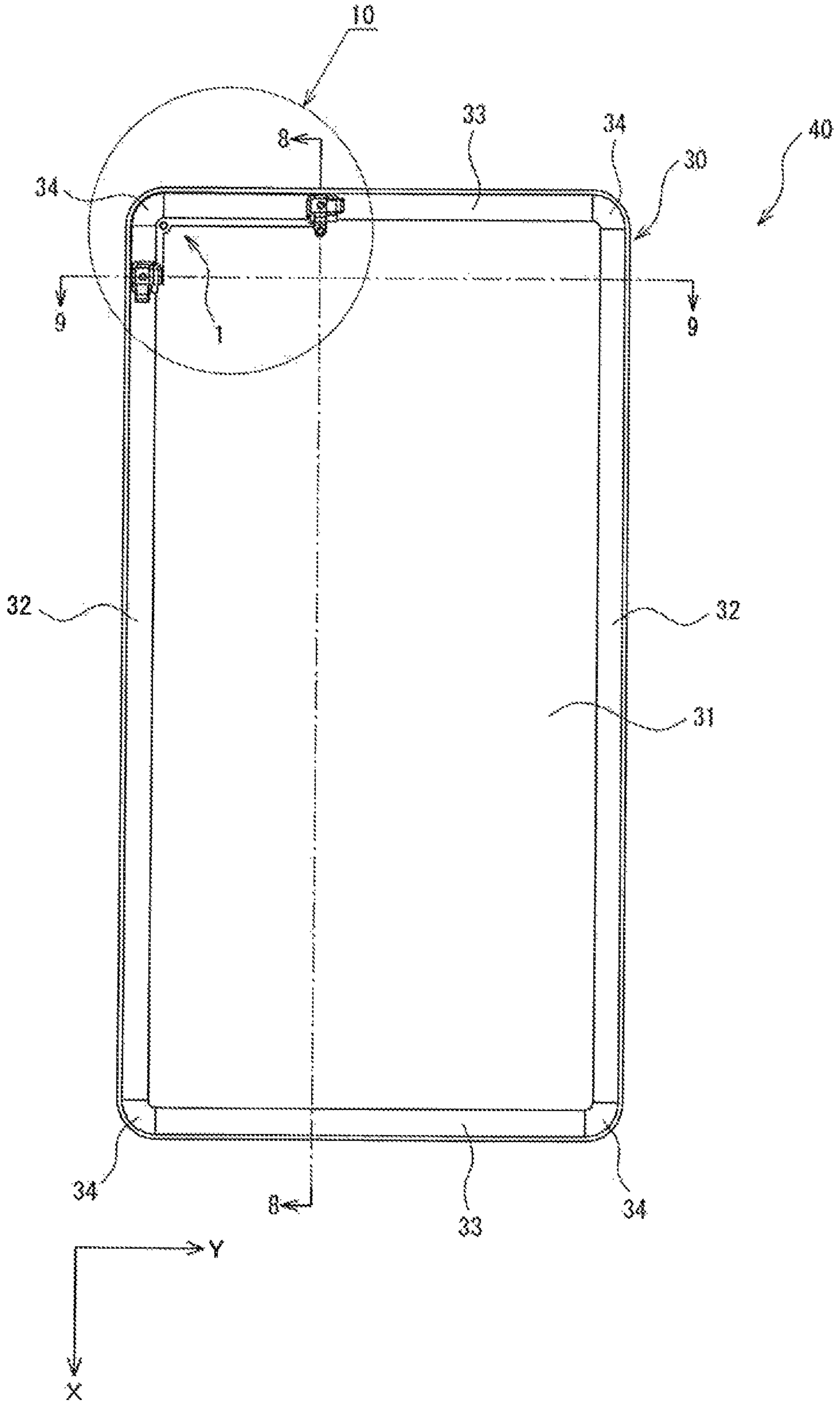
FIG. 7 is a plan view of the electrical conductive member assembly shown in FIG. 6A.
Figure 8:
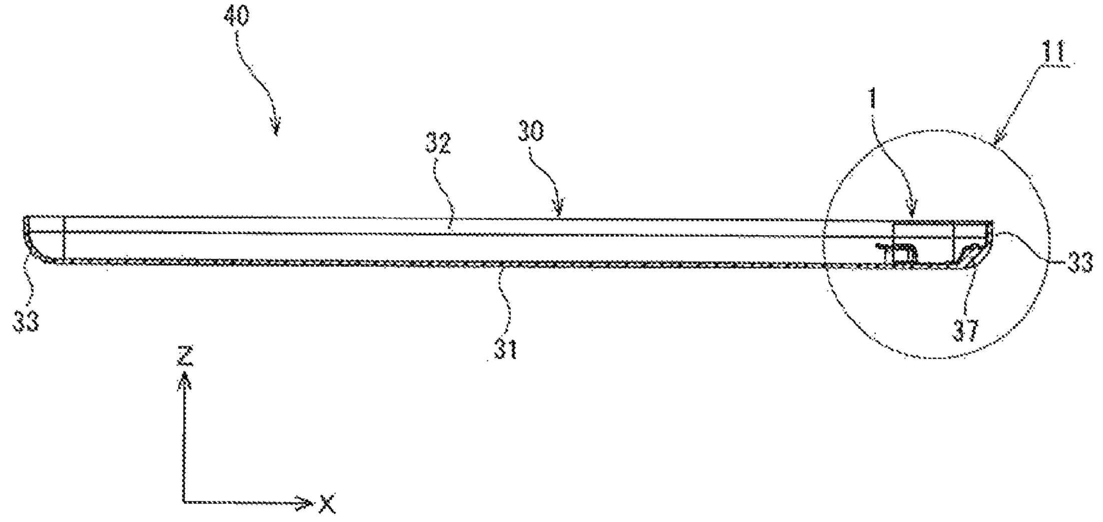
FIG. 8 is a cross-sectional view taken along line 8-8 in FIG. 7.

Moreover, as shown in FIG. 8, each end wall portion 33 has a substantially uniform thickness and has an inner surface (the surface on the flat surface portion 31 side in FIG. 8) and an outer surface (the outer surface from the flat surface portion 31 in FIG. 8), each having a one-dimensional curved surface. Herein, "one-dimensional curved surface" denotes a surface having a curved line in only one of the planes: X-Y plane; Y-Z plane; and Z-X plane as shown in FIG. 8, when the end wall portion 33 is projected onto all of the planes in FIG. 6A. Each end wall portion 33 curves and then extends such that an outer region from the side edges of the flat surface portion 31 in the elongated direction has a convex shape and extends in the Y axial direction shown in FIG. 7.

Figure 6A:
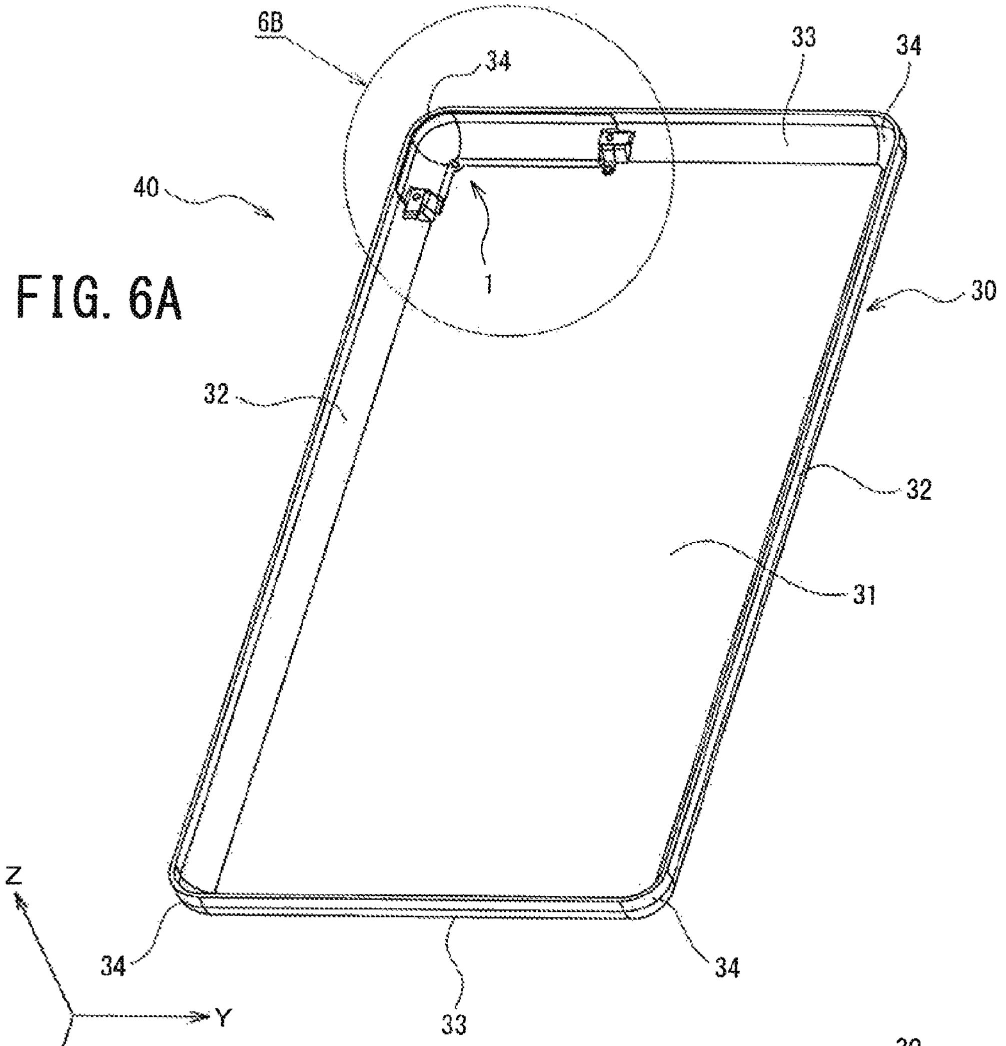
FIG. 6A is a perspective view showing an electrical conductive member assembly according to the invention having the electrical conductive member of FIG. 1 arranged in a chassis.
Figure 6B:
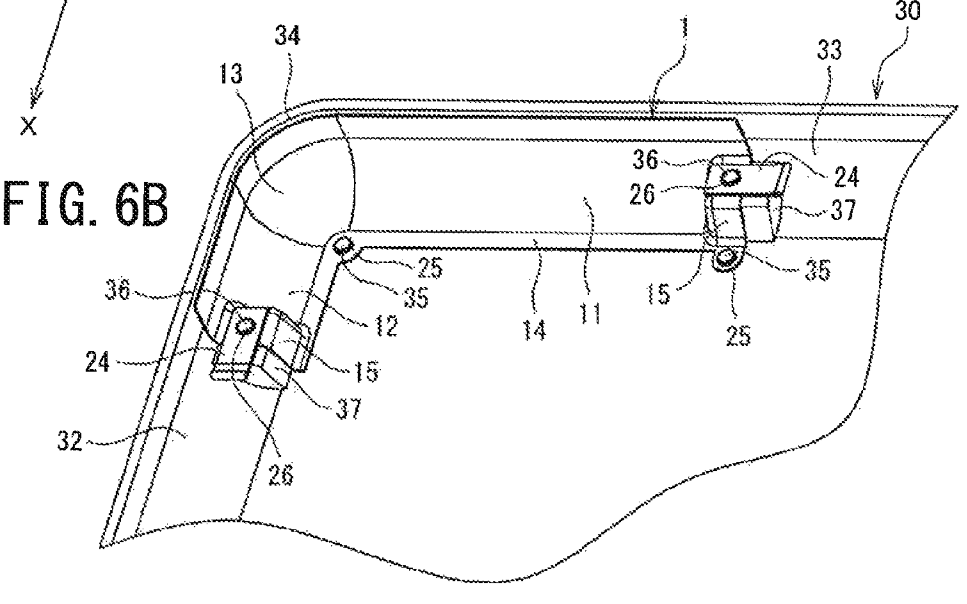
FIG. 6B is an enlarged view of a portion indicated by an arrow 6B.

Moreover, as shown in FIG. 6A and FIG. 6B, each curved section 34 connects the side wall portion 32 to the end wall portion 33, and is a part where the inner surface thereof (the surface shown in FIG. 6A) and the outer surface thereof (the rear surface opposite to the surface shown in FIG. 6A) each include a three-dimensional curved surface having a substantially uniform thickness. Herein, the "three-dimensional curved surface" denotes a surface having a curved line in all the planes: X-Y plane; Y-Z plane; and Z-X plane, when the curved section 34 is projected onto all of the planes in FIG. 6A.

Moreover, as shown in FIG. 6B, when the electrical conductive member 1 is arranged on the chassis 30, the stand 37 corresponds to the recess 15 formed in the base layer 10. The stand 37 extends from the inner surface of each end wall portion 33 and inner surface of each side wall portion 32, respectively. In addition, as shown in FIG. 11, when the recess 15 of the base layer 10 is seated on the stand 37, the projection 36 disposed on the surface of each stand 37 enter the projection receiving passageway 25 formed in the recess 15 and the projection receiving passageway 26 formed in the power-feeding portion 24, and are then deformed therein.

Furthermore, as shown in FIG. 6B, when the electrical conductive member 1 is arranged on the chassis 30, the projection 35 disposed on the surface of the flat surface portion 31, enters the projection receiving passageway 25 on the extending portion 14 and is then deformed therein.

As shown in FIG. 6A to FIG. 12, in order to arrange the electrical conductive member 1 on the chassis 30, the electrical conductive member 1 is turned over and arranged such that: (1) the top side of the first portion 11 which constitutes the base layer 10, makes contact with the inner surface of the end wall portion 33, (2) the top side of the second portion 12 makes contact with the inner surface of the side wall portion 32, and (3) the top side of the curved portion 13 makes contact with the inner surface of the curved section 34. The conductor 20 arranged on the surface of the base layer 10 makes contact with the inner surface of the end wall portion 33, the inner surface of the side wall portion 32, and the inner surface of the curved section 34.

Herein, the surface of the curved portion 13 includes a three-dimensional curved surface extending along the inner surface of the curved section 34 having a three-dimensional curved surface. Therefore, it is possible to position the electrical conductive member 1 without wrinkles or distortions, smoothly along the curved section 34 of the chassis 30 having a three-dimensional curved surface, in accordance with the shape of the curved section 34.

The top side of the first portion 11 is arranged along the inner surface of the end wall portion 33 and allows the electrical conductive member 1 to be positioned with respect to the chassis 30. Moreover, the top side of the second portion 12 is formed, so as to run along the inner surface of the side wall portion 32 and allow the electrical conductive member 1 to be positioned with respect to the chassis 30. Therefore, when the electrical conductive member 1 is arranged on the chassis 30, the shapes of the top sides of the first and the second portion 11, 12 allow the electrical conductive member 1 to be properly positioned with respect to the chassis 30. The positioning portion of the electrical conductive member 1 according to the invention includes the shape of the top side of the first portion 11 and the shape of the top side of the second portion 12.

Figure 12:
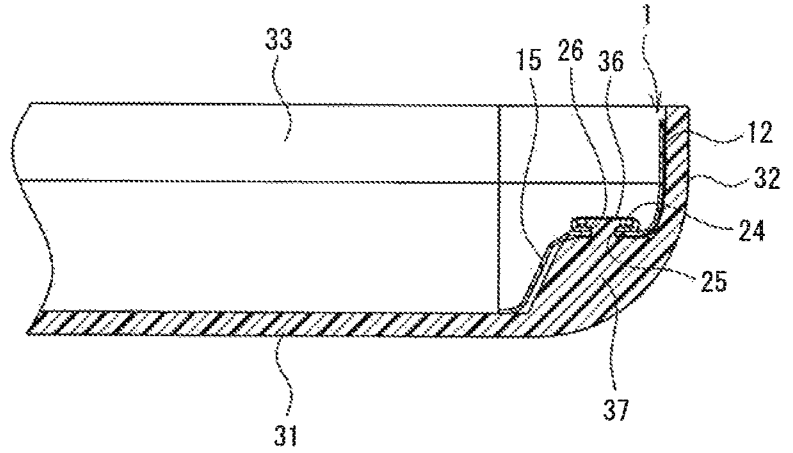
FIG. 12 is an enlarged view of a portion indicated by an arrow 12 in FIG. 9.

Moreover, as shown in FIG. 6B, FIG. 11, and FIG. 12, when the electrical conductive member 1 is turned over and arranged on the chassis 30, the recess 15 of the base layer 10 and the power-feeding portion 24 are seated on the stand 37 of the chassis 30. Herein, as mentioned above, the stand 37 is raised from the inner surface of each end wall portion 33 and inner surface of each side wall portion 32. Therefore, a distance between the power-feeding portion 24 and a circuit board (not illustrated) arranged in the chassis 30 may be made shorter than with the configuration in which the power-feeding portion 24 is arranged directly on the inner surface of each end wall portion 33 and on the inner surface of each side wall portion 32. Accordingly, the height of a contact (not illustrated) connected to the circuit board in an initial state (i.e., state before the contact deforms elastically) is minimized, thereby ensuring stable contact of the power-feeding portion 24 with the contact. When the contact in the initial state is high, there is a high risk that another object is caught during use, or the contact is unnecessarily deformed.

As shown in FIG. 11 and FIG. 12, the projection 36 formed on the stand 37 enters and passes through the projection receiving passageway 25 of the recess 15 and the projection receiving passageway 26 of the power-feeding portion 24. Moreover, as shown in FIG. 6B, when the electrical conductive member 1 is turned over and arranged on the chassis 30, the projection 35 formed on the flat surface portion 31 of the chassis 30 enters and passes through the projection receiving passageway 25 formed in the extending portion 14 of the base layer 10. The electrical conductive member 1 can be positioned in the chassis 30 by the projections 36 and 35 passing through the projection receiving passageway 25 of the recess 15 and projection receiving passageway 25 of the extending portion 14, respectively. Therefore, these projection receiving passageways 25 also constitute the "positioning portion".

These projections 35 and 36 are crushed (or heat staked). As a result, the electrical conductive member 1 is secured to the chassis 30.

As such, according to the electrical conductive member 1 in the shown embodiment, the curved portion 13 having a three-dimensional curved surface is formed at a portion of the base layer 10 in which the conductor 20 is provided, the curved portion 13 can be positioned without wrinkles or distortions, smoothly along the curved section 34 in accordance with the shape of the curved section 34 in the chassis 30 provided with the curved section 34 having a three-dimension curved surface. Herein, since the base layer 10 is a film, it is thinner than that formed by molding resin, such as MID antenna or LDS antenna. Therefore, the demand for downsizing of the electrical conductive member 1 can be met.

Moreover, according to the electrical conductive member 1 in the present embodiment, thickness t1 of the curved portion 13 is thinner than the portion of the base layer 10 excluding the curved portion 13, to be specific, thickness t2 of the first portion 11, thickness of the second portion 12, and thickness t2 of the extending portion 14, respectively. Therefore, the curved portion 13 is capable of following the shape of the curved section 34 for arranging the curved portion 13 in the curved section 34.

Furthermore, a positioning portion (i.e. shapes of the top sides of the first and the second portion 11 and 12, and projection receiving passageway 25 in the embodiment shown) for the chassis 30 in which the electrical conductive member 1 is arranged is formed on the base layer 10. Therefore, the electrical conductive member 1 can be easily positioned on the chassis 30 for providing the electrical conductive member 1 on the chassis 30. Moreover, a securing portion (i.e. the projection receiving passageways 25 formed in the extending portion 14 and the recess 15 in the embodiment shown) for the chassis 30 in which the electrical conductive member 1 is arranged is formed in the base layer 10. Therefore, the electrical conductive member 1 arranged on the chassis 30 can be easily secured to the chassis 30.

Furthermore, the power-feeding portion 24 is positioned on the conductor 20.

Therefore, the power can be supplied to the conductor 20 from the power-feeding portion 24. The power-feeding portion 24 is formed by being folded over by 180 degrees from the end of the top side of the conductor 20 arranged on the surface of the base layer 10 to the bottom side. Therefore, when the electrical conductive member 1 is turned over and arranged in order for the conductors 20 to make contact with the inner surface of the end wall portion 33, the inner surface of the side wall portion 32, and the inner surface of the curved section 34, the power-feeding portion 24 folded over by 180 degrees to the bottom side of the conductor 20 is exposed. Therefore, the power can be easily supplied to the power-feeding portion 24 from a component for supplying the power thereto.

Figure 13:
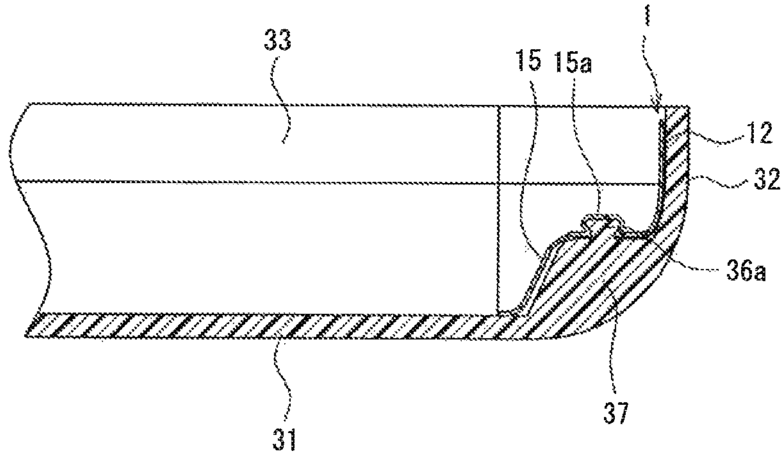
FIG. 13 is a cross-sectional view showing a first modification of a positioning portion and a securing portion.

It is to be noted that the electrical conductive member 1 shown in FIG. 1 to FIG. 12 is positioned in the chassis 30 using the projection 36 formed on the stand 37 that pass through the projection receiving passageway 25 of the recess 15. Then the electrical conductive member 1 is secured to the chassis 30 by deforming (or heat staking) the projection 36. On the other hand, as shown in FIG. 13, the recess 15 may be arranged by forming a covering portion 15*a* in such a manner to cover the projection 36*a* formed on the stand 37 without forming the projection receiving passageway 25 in the recess 15. Therefore, it is possible to position the electrical conductive member 1. The electrical conductive member 1 can be secured to the chassis 30 by heating and deforming this covering portion 15*a*.

Figure 14:
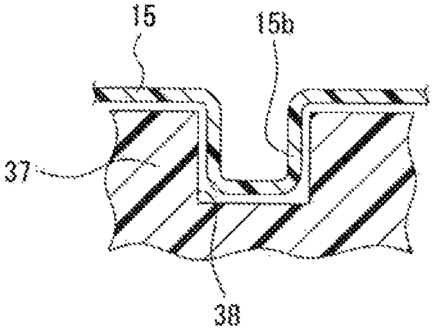
FIG. 14 shows a second modification of the positioning portion.

Moreover, as shown in FIG. 14, a cavity 38 may be formed in the stand 37 Without forming the projection receiving passageway 25 in the recess 15 of the base layer 10, while a projection portion 15*b* may be formed by arranging the recess 15 of the base layer 10 along the recess 38. The electrical conductive member 1 can be positioned in the chassis 30 by arranging the projection portion 15*b* of the base layer 10 along the recess 38 of the stand 37.

Figure 15:
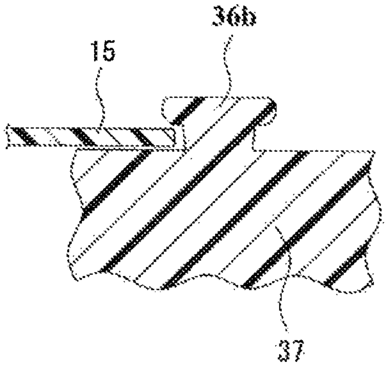
FIG. 15 is a cross-sectional view of a third modification of the positioning portion and the securing portion.

Furthermore, as shown in FIG. 15, the electrical conductive member 1 may be positioned by pressing a portion of the side surface of the recess 15 in the base layer 10 against a side surface of a projection 36*b* formed in the stand 37 without forming the projection receiving passageway 25 in the recess 15 of the base layer 10. Furthermore, the electrical conductive member 1 can be secured to the chassis 30 by deforming (heat staking) the projection 36*b*.

Figure 16:
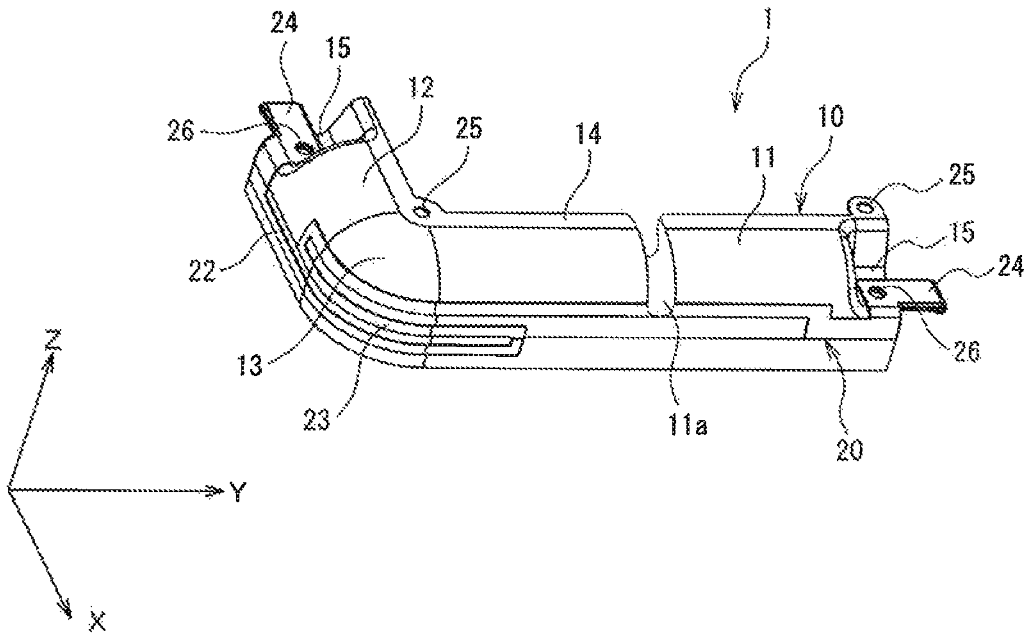
FIG. 16 is a perspective view of the electrical conductive member having a positioning portion of a fourth modification.
Figure 17A:
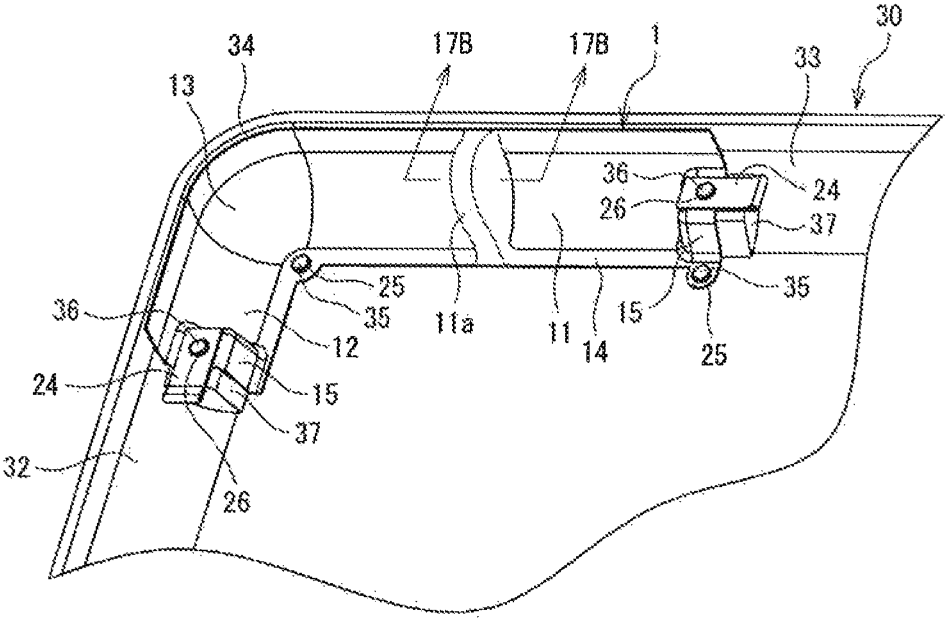
FIG. 17A is a close up perspective view of an electrical conductive member assembly having the electrical conductive member in FIG. 16 deployed in a chassis with a projection.
Figure 17B:
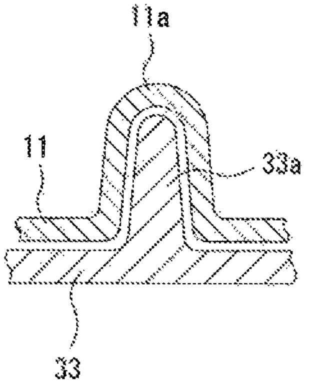
FIG. 17B is a cross-sectional view taken along a line 17B-17B in FIG. 17A.

Moreover, as shown in FIG. 16, FIG. 17A, and FIG. 17B, the "positioning portion" may be formed as a straddling portion 11*a*, which straddles a projection 33*a* formed to project from the end wall portion 33 of the chassis 30. As shown in FIG. 17A and FIG. 17B, when the electrical conductive member 1 is arranged on the chassis 30, the straddling portion 11*a* straddles the projection 33*a* of the chassis 30, so as to position the electrical conductive member 1 to the chassis 30. It is to be noted that the projection 33*a* may be formed not only on the end wall portion 33 of the chassis 30 but also on the side wall portion 32 or the flat surface portion 31. The straddling portion 11*a* should be formed at a position straddling over the projection 33*a* on the base layer 10.

Next, another electrical conductive member according the invention will be described with reference to FIG. 18 to FIG. 29. In FIG. 18 to FIG. 29, the same component members as those shown in FIG. 1 to FIG. 12 are given with the same reference numerals, and the descriptions thereof will be omitted.

The electrical conductive member 1 shown in FIG. 18 to FIG. 29 is the same in the basic configuration as that of the electrical conductive member 1 shown in FIG. 1 to FIG. 12. However, the configurations of the conductor 20 and configuration of the power-feeding portion 24 are different.

That is, in the electrical conductive member 1 shown in FIG. 1 to FIG. 12, the conductor 20 is arranged on a portion of the top side of the base layer 10. On the other hand, in the electrical conductive member 1 shown in FIG. 18 to FIG. 29, the conductor 20 is arranged along a portion of the bottom side of the base layer 10.

Figure 22:
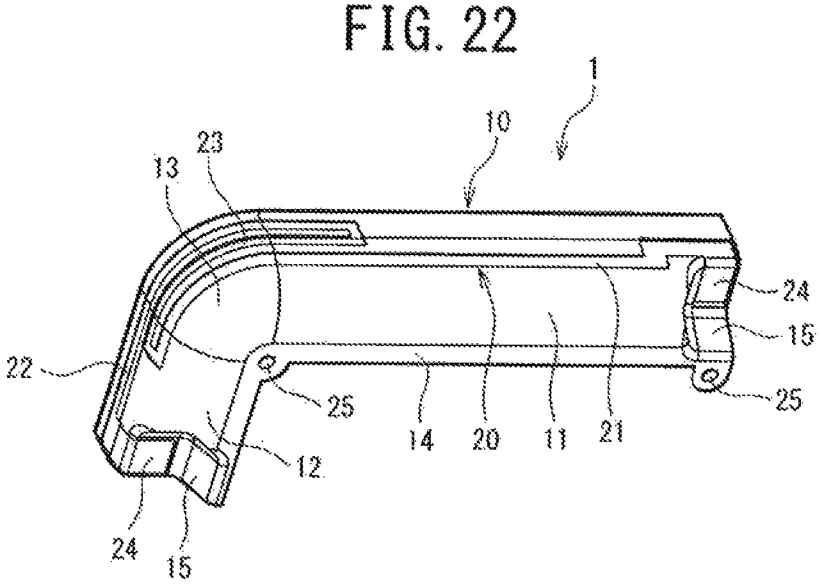
FIG. 22 is a perspective view of the electrical conductive member of FIG. 18, showing the bottom side of the electrical conductive member.

More specifically, as shown in FIG. 22, the conductor 20 is arranged at a portion of the bottom side of the base layer 10, and includes the first, the second, and the third conductive portions 21, 22, and 23. The first conductive portion 21 is formed by a planate electrical conductive pattern extending towards one end of the first portion 11 on the bottom side in the Y axial direction from the other end thereof (right end in FIG. 19A). The second conductive portion 22 is formed by a planate electrical conductive pattern extending towards one end of the second portion 12 on the bottom side in the X axial direction from the other end thereof (upper end in FIG. 19A). The third conductive portion 23 is formed on the bottom side of the curved portion 13 by a planate electrical conductive pattern extending towards one end of the second conductive portion 22 from one end of the first conductive portion 21 in a thrice folded manner in the embodiment shown.

Moreover, in the electrical conductive member 1 shown in FIG. 1 to FIG. 12, the power-feeding portion 24 is formed by folding the conductor 20 towards the recess 15 from the other end of the first conductive portion 21 in the Y axial direction, and then folding back by 180 degrees to the bottom side the first conductive portion 21 from the end of the top side. Moreover, the power-feeding portion 24 on the second conductive portion 22 side is formed by folding the conductor 20 towards the recess 15 from the other end of the second conductive portion 22 in the X axial direction and then folding back by 180 degrees towards the bottom side of the second conductive portion 22 from the end of the top side.

On the other hand, in the electrical conductive member 1 shown in FIG. 18 to FIG. 29, the power-feeding portion 24 on the first conductive portion 21 side is formed by folding the conductor 20 towards the bottom side of the recess 15 from the other end of the first conductive portion 21 in the Y axial direction as shown in FIG. 22. Moreover, as shown in FIG. 22, the power-feeding portion 24 on the second conductive portion 22 side is formed by folding the conductor 20 towards the bottom side of the recess 15 from the other end of the second conductive portion 22 in the X axial direction.

Figure 18:
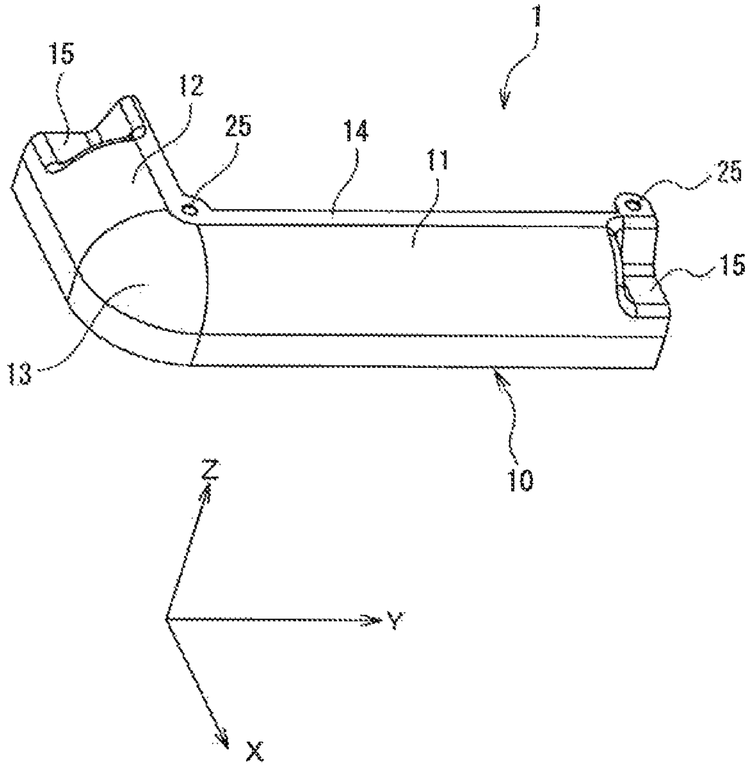
FIG. 18 is a perspective view of another electrical conductive member according to the invention.
Figure 19A:
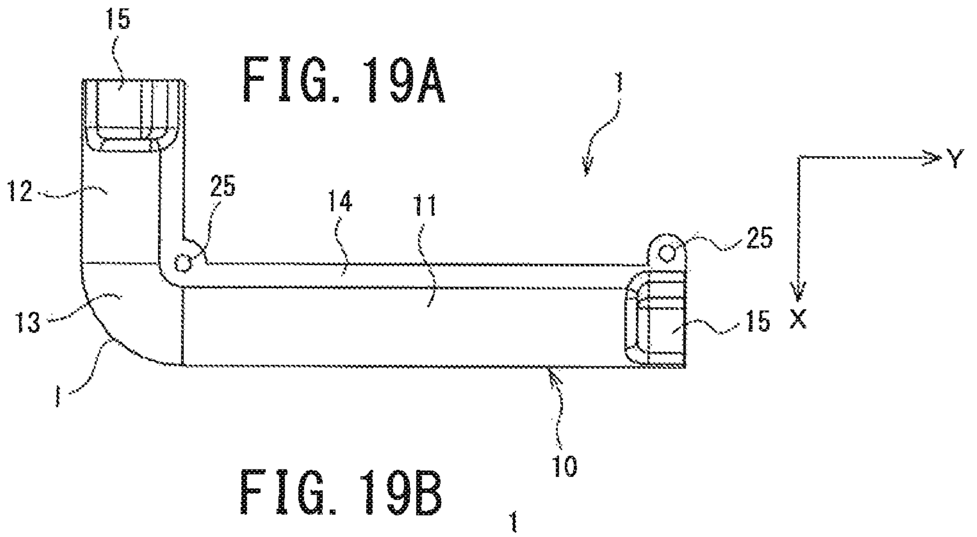
FIG. 19A is a plan view of the electrical conductive member of FIG. 18.
Figure 19B:
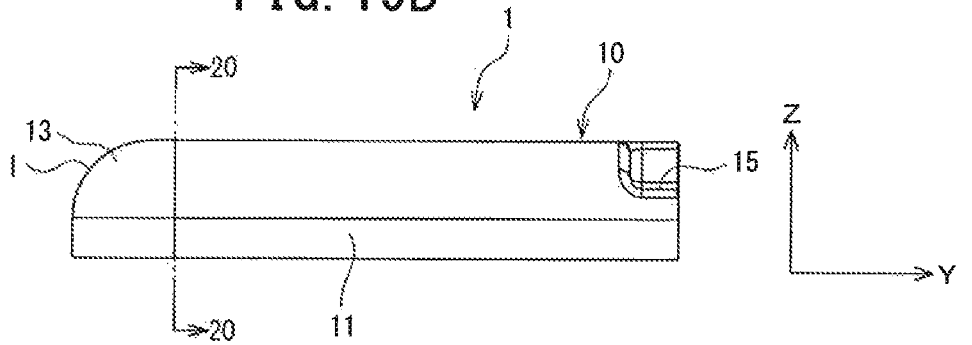
FIG. 19B is a front view of the electrical conductive member of FIG. 18.
Figure 19C:
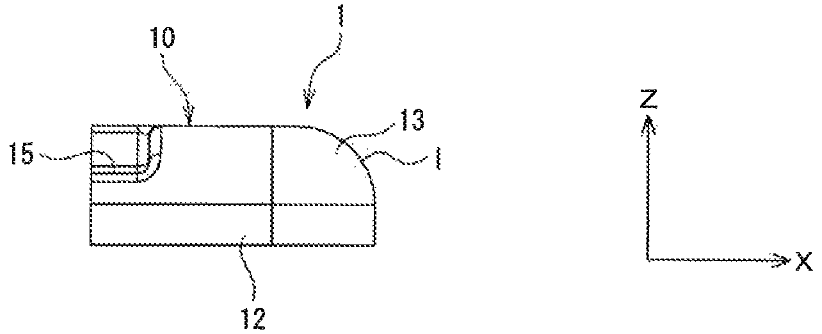
FIG. 19C is a left side view of the electrical conductive member of FIG. 18.
Figure 19D:
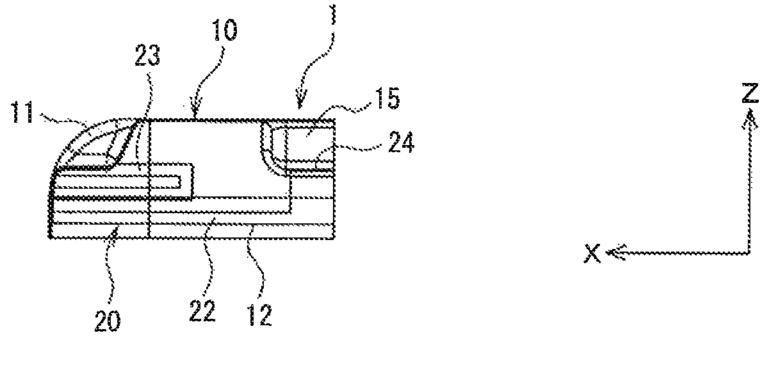
FIG. 19D is a right side view of the electrical conductive member of FIG. 18.

As shown in FIG. 23A to FIG. 29, in order to provide the electrical conductive member 1 shown in FIG. 18 in the chassis 30, the electrical conductive member 1 is turned over and arranged such that the top side of the first portion 11 constituting the base layer 10 makes contact with the inner surface of the end wall portion 33, the top side of the second portion 12 makes contact with the inner surface of the side wall portion 32, and the top side of the curved portion 13 makes contact with the inner surface of the curved section 34. Accordingly, the conductor 20 arranged on the bottom side of the base layer 10 is exposed.

Herein, the top side of the curved portion 13 includes a three-dimensional curved surface along the inner surface of the curved section 34 having a three-dimensional curved surface in the same way as the surface of the curved portion 13 in the electrical conductive member 1 shown in FIG. 1 to FIG. 12. Therefore, it is possible to arrange the electrical conductive member 1 without wrinkles or distortions, smoothly along the curved section 34 by following the shape of the curved section 34 of the chassis 30 provided with the curved section 34 having a three-dimensional curved surface.

Figure 23A:
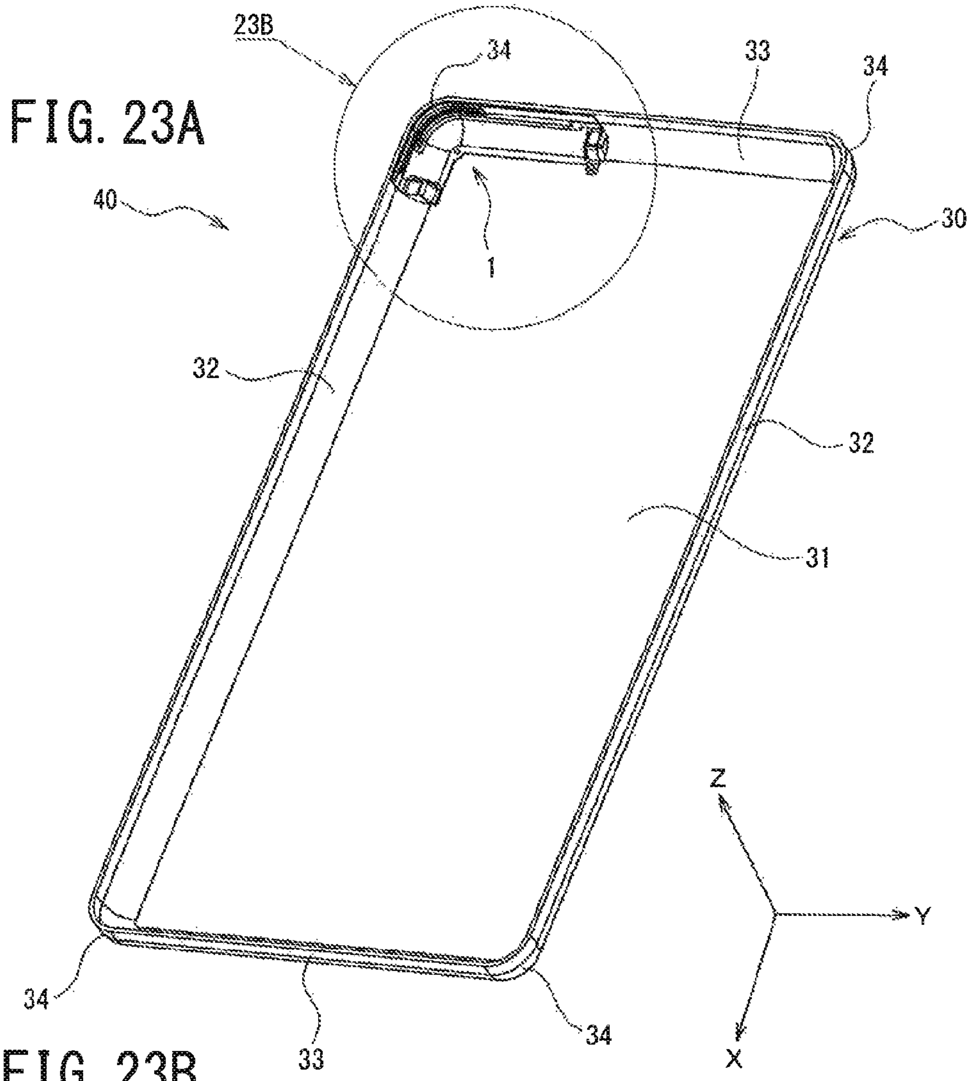
FIG. 23A is a perspective view of an electrical conductive member assembly having the electrical conductive member of FIG. 18 in a chassis.
Figure 23B:
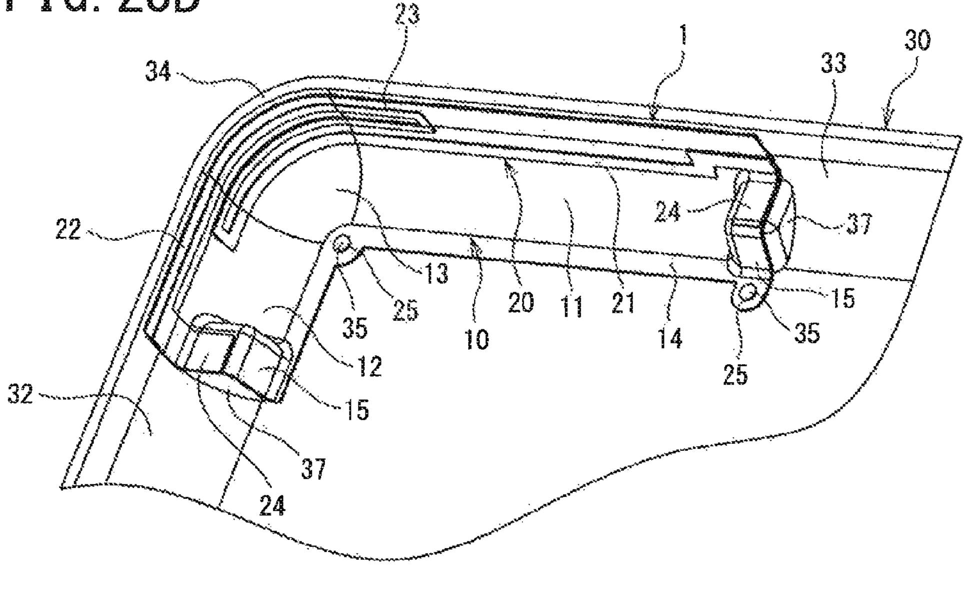
FIG. 23B is an enlarged view of a portion indicated by an arrow 23B in FIG. 23A.
Figure 24:
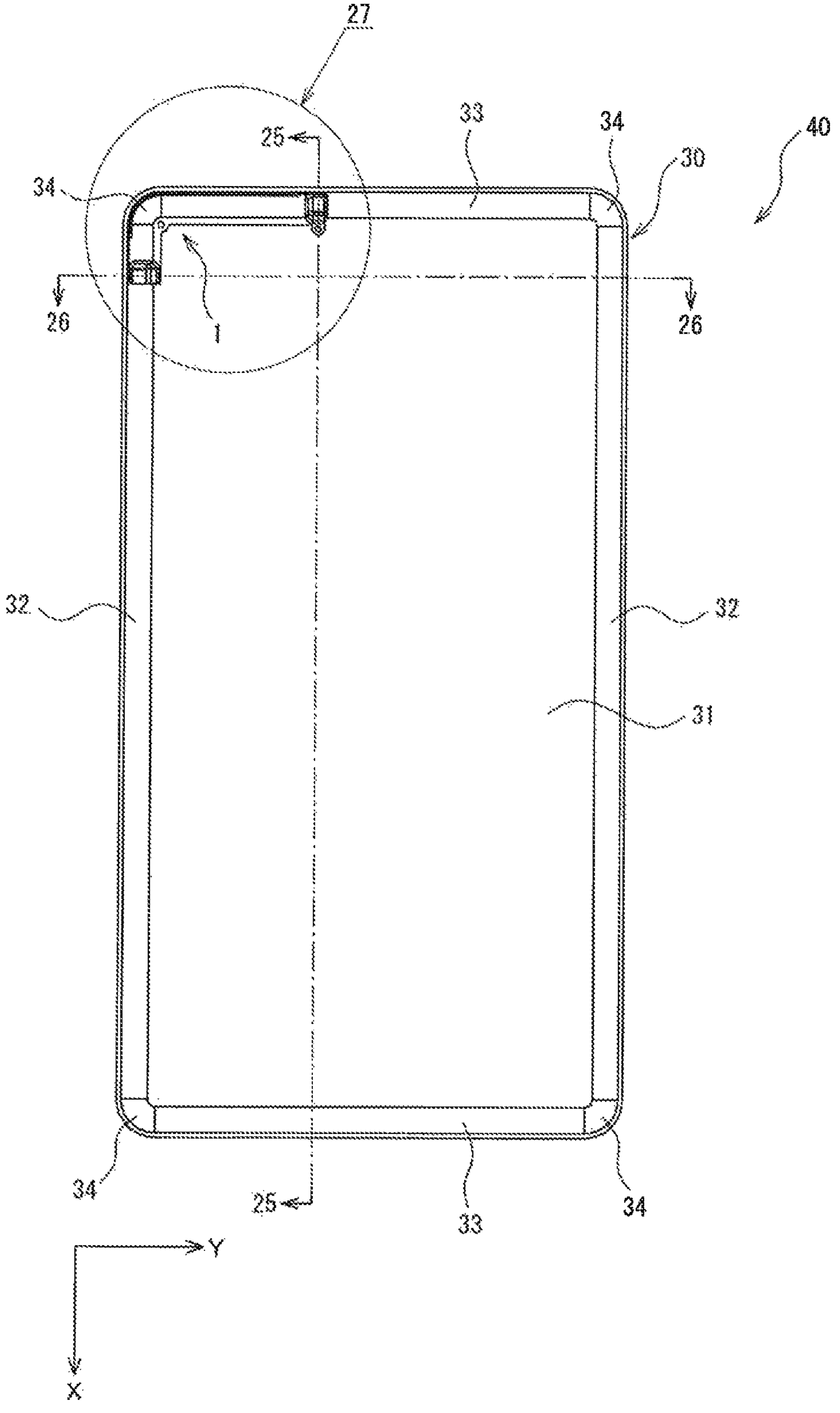
FIG. 24 is a plan view of the electrical conductive member assembly having the electrical conductive member of FIG. 18 arranged in the chassis.
Figure 25:
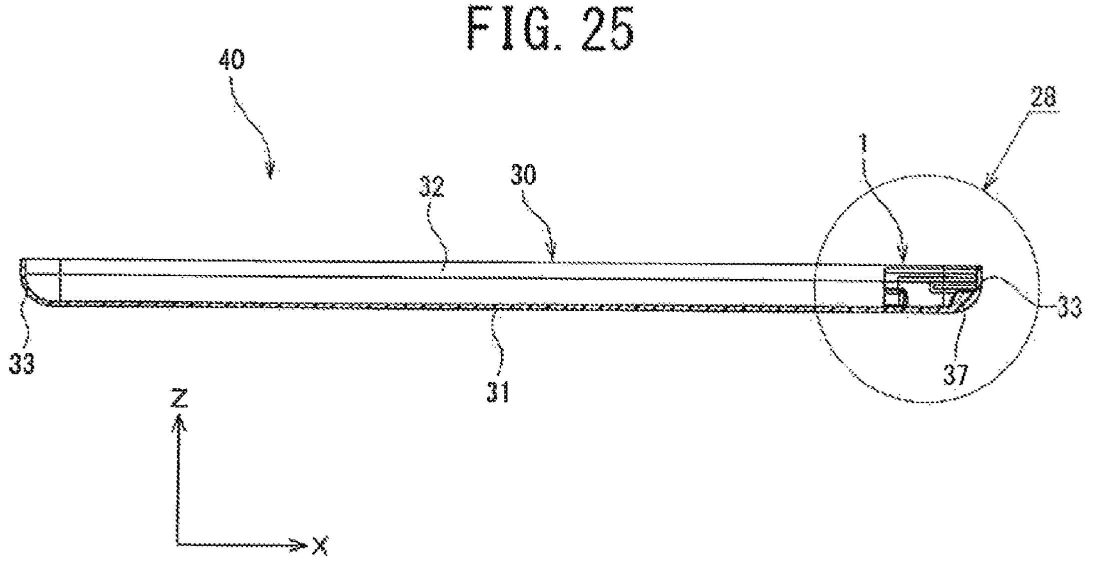
FIG. 25 shows a cross-sectional view taken along line 25-25 in FIG. 24.
Figure 26:
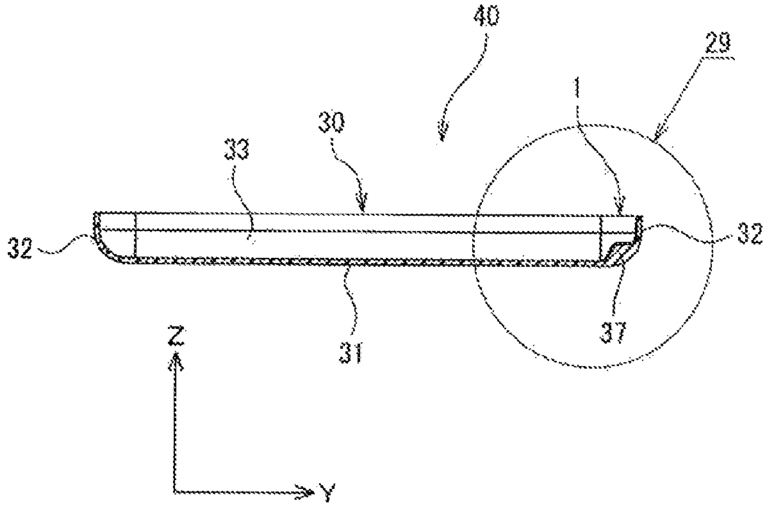
FIG. 26 shows a cross-sectional view taken along line 26-26 in FIG. 24.
Figure 27:
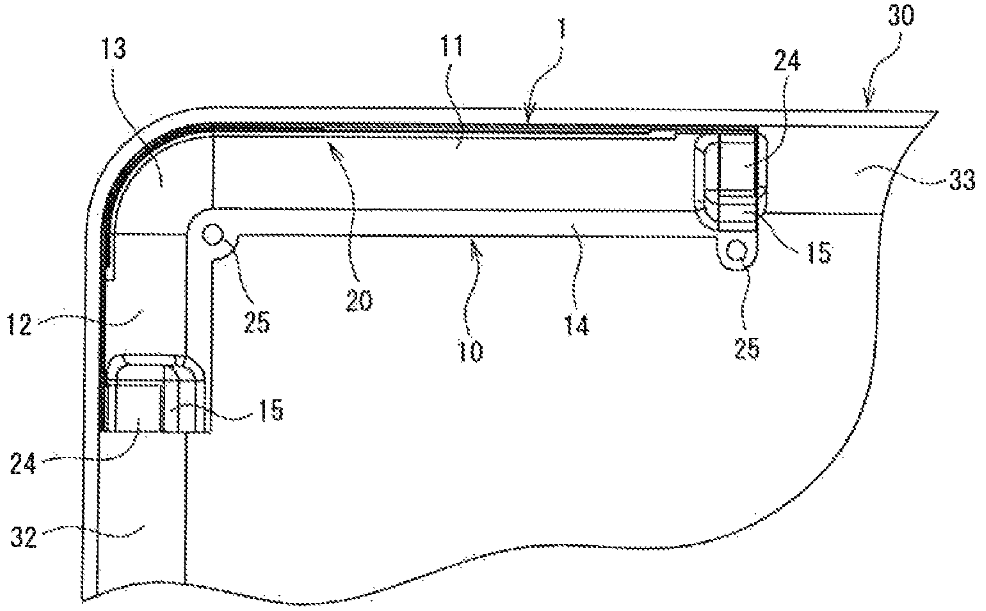
FIG. 27 is an enlarged view of a portion indicated by an arrow 27 in FIG. 24.
Figure 28:
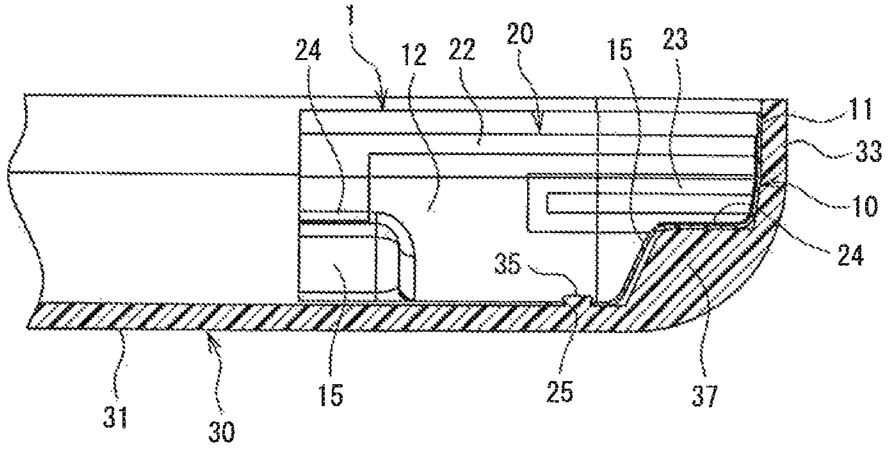
FIG. 28 is an enlarged view of a portion indicated by an arrow 28 in FIG. 25.
Figure 29:
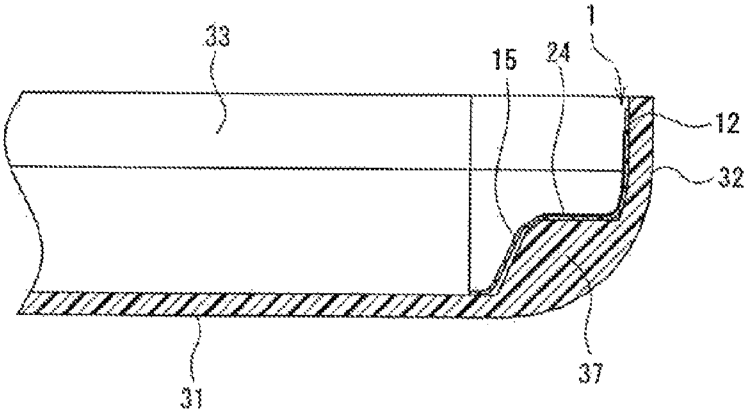
FIG. 29 is an enlarged view of a portion indicated by an arrow 29 in FIG. 26.

Moreover, as shown in FIG. 23B, FIG. 28, and FIG. 29, when the electrical conductive member 1 is turned over and arranged on the chassis 30, the recess 15 and the power-feeding portion 24 of the base layer 10 are seated on the stand 37 formed in the chassis 30. Furthermore, as shown in FIG. 23B, when the electrical conductive member 1 is turned over and arranged on the chassis 30, the projection 35 formed on the flat surface portion 31 of the chassis 30 enters and passes through the projection receiving passageway 25 formed in the extending portion 14 of the base layer 10.

The projection 35 is then deformed (for instance, heat staked) to secure the electrical conductive member 1 to the chassis 30.

Accordingly, for the electrical conductive member 1 in the shown embodiment, it is possible to arrange the curved portion 13 without creating wrinkles or distortions, but rather smoothly along the curved section 34 by following the shape of the curved section 34 of the chassis 30. Herein, since the base layer 10 is a film, it is thinner than an antenna molded from resin, such as an MID antenna or an LDS antenna. Therefore, it is possible to meet the demand for downsizing of the electrical conductive member 1.

Figure 20:
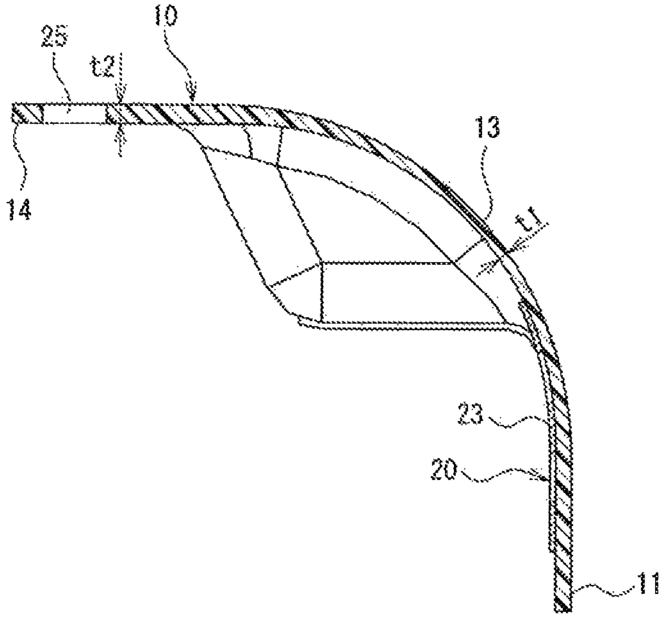
FIG. 20 is a cross-sectional view taken along line 20-20 in FIG. 19B.
Figure 21A:
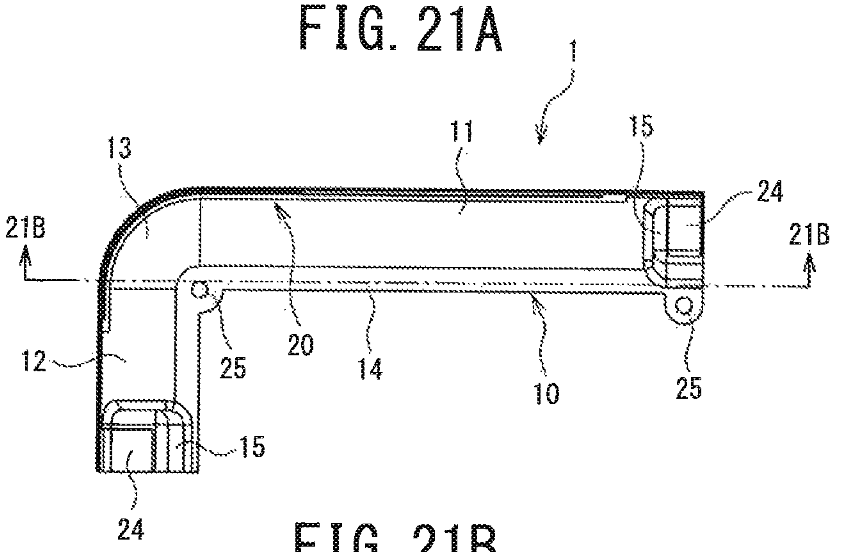
FIG. 21A is a bottom view of the electrical conductive member of FIG. 18.
Figure 21B:
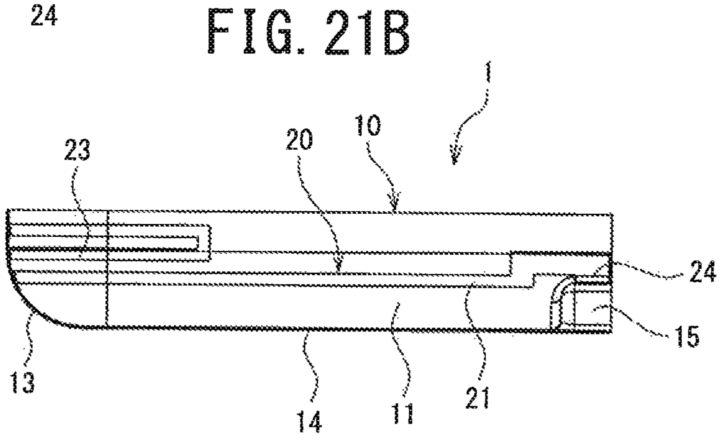
FIG. 21B is a cross-sectional view taken along line 21B-21B in FIG. 21A.

Moreover, even in the electrical conductive member 1 of the shown embodiment in FIG. 20, thickness t1 of the curved portion 13 is thinner than a portion of the base layer 10 excluding the curved portion 13, to be specific, thickness t2 of the first portion 11, thickness of the second portion 12, and thickness t2 of the extending portion 14, respectively. Therefore, the curved portion 13 may be made to follow the shape of the curved section 34 easily when arranging the curved portion 13 on the curved section 34.

Moreover, even in the electrical conductive member 1 according to the invention, a positioning portion (i.e shapes of the top sides of the first portion 11 and the second portion 12, and the projection receiving passageways 25) for the chassis 30 in which the electrical conductive member 1 should be arranged is formed on the base layer 10. Therefore, it is possible to position the electrical conductive member 1 easily on the chassis 30 for providing the electrical conductive member 1 with respect to the chassis 30. Moreover, a securing portion (i.e. the projection receiving passageway 25 disposed on the extending portion 14) is formed on the base layer 10 for the chassis 30 in which the electrical conductive member 1 should be arranged. Therefore, it is possible to secure the electrical conductive member 1 disposed on the chassis 30 easily to the chassis 30.

Furthermore, the power-feeding portion 24 disposed along the conductor 20 constituting the electrical conductive member 1. Therefore, the power can be supplied to the conductor 20 from the power-feeding portion 24.

In the embodiments shown, the power-feeding portion 24 is formed by folding an end of the conductor 20 provided on the bottom side of the base layer 10. Therefore, the power-feeding portion 24 is exposed, even by turning over and providing the electrical conductive member 1, and making the conductor 20 in contact with the inner surface of the end wall portion 33, the inner surface of the side wall portion 32, and the inner surface of the curved section 34. Accordingly, power can be easily supplied to the power-feeding portion 24 from the component for supplying the power to the power-feeding portion 24.

Next, referring to FIG. 30, another example of a method for securing an electrical conductive member according to the invention will be described below.

As described above, in the electrical conductive member 1 shown in FIG. 1, when the electrical conductive member 1 is turned over and arranged on the chassis 30, the projection 35 formed on the flat surface portion 31 of the chassis 30 enters and penetrates the projection receiving passageway 25 formed in the extending portion 14 of the base layer 10. The electrical conductive member 1 is positioned in the chassis 30 using the projection 36 passing through the projection receiving passageway 25 of the recess 15 and the projection 35 passing through the projection receiving passageway 25 of the extending portion 14. These projections 35 and 36 are then deformed (i.e. heat staked). Accordingly, the electrical conductive member 1 may be secured to the chassis 30.

As mentioned above, when the electrical conductive member 1 shown in FIG. 18 is turned over and arranged on the chassis 30, the projection 35 formed on the flat surface portion 31 of the chassis 30 enters and passes through the projection receiving passageway 25 formed in the extending portion 14 of the base layer 10. The projection 35 is then deformed (i.e. heat staked), so as to secure the electrical conductive member 1 to the chassis 30.

Figure 30:
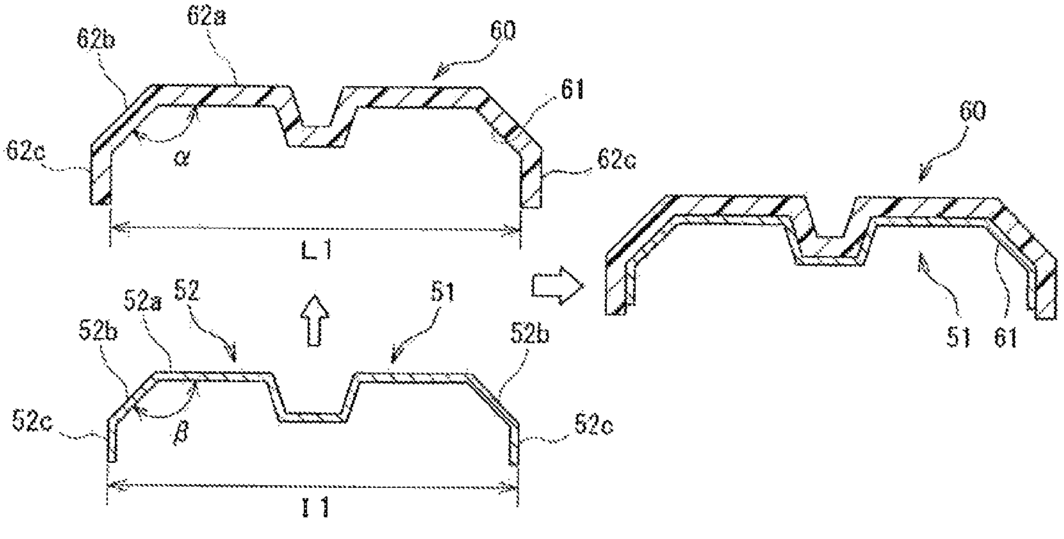
FIG. 30 is a diagram showing an exemplary method for securing an electrical conductive member according to the invention to a chassis having a recess.

On the other hand, although the electrical conductive member 51 shown in FIG. 30 has the same configuration as the electrical conductive member 1 shown in FIG. 1 or FIG. 18, the electrical conductive member 51 is provided to enter the recess 61 formed in the chassis 60. When the electrical conductive member 51 is arranged to enter the recess 61, it has dimensions to bias the recess 61 outward. When the electrical conductive member 51 is arranged in the recess 61, the electrical conductive member 51 presses the recess 61 outward. This allows the electrical conductive member 51 to fit snug in the recess 61, thereby securing the electrical conductive member 51 to the chassis 60.

Figure 36:
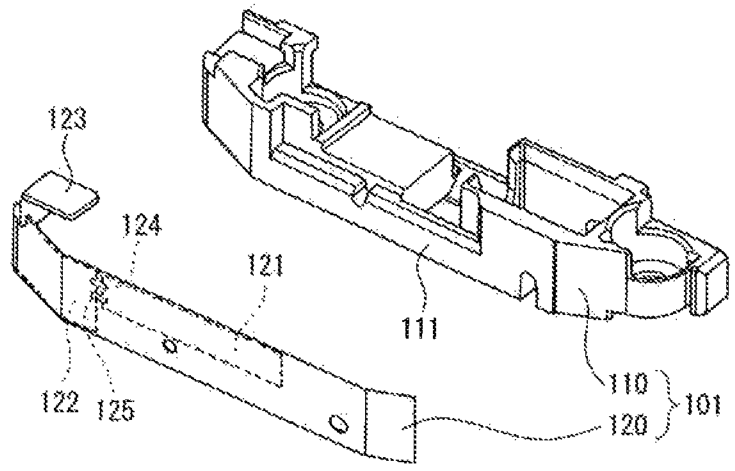
FIG. 36 PRIOR ART
FIG. 36 is an exploded perspective view of a known antenna device.

Normally, a slit for bending the FPC 120 is required for inserting the conventional FPC 120 shown in FIG. 36 into the recess 61 of the chassis 60, and its rigidity should thus become lower structurally. However, in the case of the electrical conductive member 51, there is no such concern.

Moreover, since thickness of the electrical conductive member 51 is thinner than the MID antenna and the LDS antenna, elastically deformable range may be larger.

Dimensions of the electrical conductive member 51 shown in FIG. 30 will be described now.

First of all, the chassis 60 includes a recess 61 on one side, a bottom portion 62*a*, and a pair of inclining portions 62*b* extending obliquely downward from both ends of the bottom portions 62*a* at an inclination angle α toward a lower portion of the bottom portion 62*a*. Meanwhile, the chassis 60 includes a pair of outer wall portions 62*c* extending downward vertically from a tip end of each inclining portion 62*b*. L1 is the width of the recess 61 or width between the internal wall surfaces of the pair of outer wall portions 62*c*.

The electrical conductive member 51, on the other hand, includes a base layer 52 with a bottom portion 52*a*, a pair of inclining portions 52*b* extending obliquely downward from both ends of the bottom portions 52*a* at an inclination angle β towards the lower portion of the bottom portion 52*a*, and a pair of outer wall portions 52*c* extending vertically towards the lower part of each inclining portion 52*b* from the tip end. I1 is the width of the electrical conductive member 51 or width between the external wall surfaces of the pair of outer wall portions 52*c*.

The width I1 of the electrical conductive member 51 is a value that satisfies a relationship I1>L1 relative to the width L1 of the recess 61. The electrical conductive member 51 is thus set to allow the electrical conductive member 51 to press the recess 61 outward, when electrical conductive member 51 is arranged to enter the recess 61.

It is to be noted that the inclination angle α of each inclining portion 62*b* in the chassis 60 in FIG. 30 may be different from or the same as inclination angle β of each inclining portion 52*b* in the electrical conductive member 51. However, when β>α is satisfied, dimensions of the electrical conductive member 51 may be set to values that allow the electrical conductive member 51 to press the recess 61 outward, even if I1>L1 is not satisfied.

Next, with reference to FIG. 31, a description will be given of another method for securing an electrical conductive member according to the invention.

Figure 31:
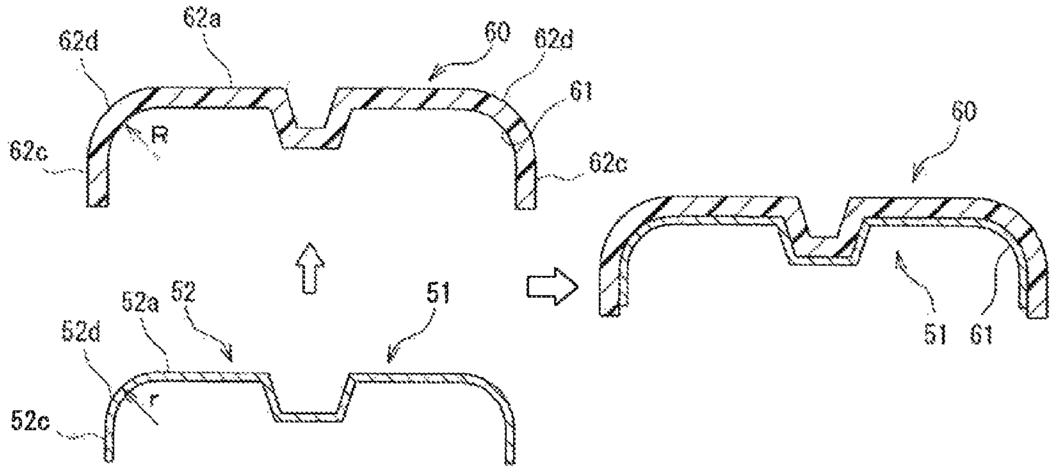
FIG. 31 is a diagram showing another exemplary method for securing an electrical conductive member according to the invention to a chassis having a recess.

Although the electrical conductive member 51 shown in FIG. 31 has the same configuration as the electrical conductive member 1 shown in FIG. 1 or FIG. 18, the electrical conductive member 51 is provided to enter the recess 61 formed in the chassis 60, which is an assembled component, in the same manner as the electrical conductive member 51 shown in FIG. 30. When the electrical conductive member 51 enters the recess 61, the dimension thereof is a value to press the recess 61 outward. When the electrical conductive member 51 is provided in the recess 61, the electrical conductive member 51 presses the recess 61 outward, and the electrical conductive member 51 thus fits snug into the recess 61, thereby securing the electrical conductive member 51 to the chassis 60.

Herein, the electrical conductive member 51 shown in FIG. 31 is have a different shape and different dimensions from those of the electrical conductive member 51 shown in FIG. 30.

Firstly, the chassis 60 has the recess 61 on one side and includes a bottom portion 62*a* and a pair of curved sections 62*d*, each curving from the both ends of the bottom portion 62*a* to the bottom portion 62*a*. The chassis 60 includes a pair of outer wall portions 62*c*, each extending vertically from the tip end of each curved section 62*d* towards the lower portion. "R" is a radius of curvature of the inner wall surface of each curved section 62*d*.

The electrical conductive member 51, on the other hand, includes a base layer 52 having a bottom portion 52*a*, curved portions 52*d*, which curve from both ends of the bottom portion 52*a* relative to the bottom portion 62*a*, and a pair of outer wall portions 52*c*, each extending vertically from the tip end of each curved portion 52*d* to the lower portion. "r" is a radius of curvature of the external wall surface of each curved portion 52*d*.

The radius of curvature r of each curved portion 52*d* in the electrical conductive member 51 is set with respect to the radius of curvature R of each curved section 62*d* in the chassis 60 to satisfy r>R. Therefore, the electrical conductive member 51 may be set to the dimensions to press the recess 61 outward, when electrical conductive member 51 is arranged to enter the recess 61.

Next, referring to FIG. 32, a description will be given to another method for securing an electrical conductive member according to the invention.

Figure 32:
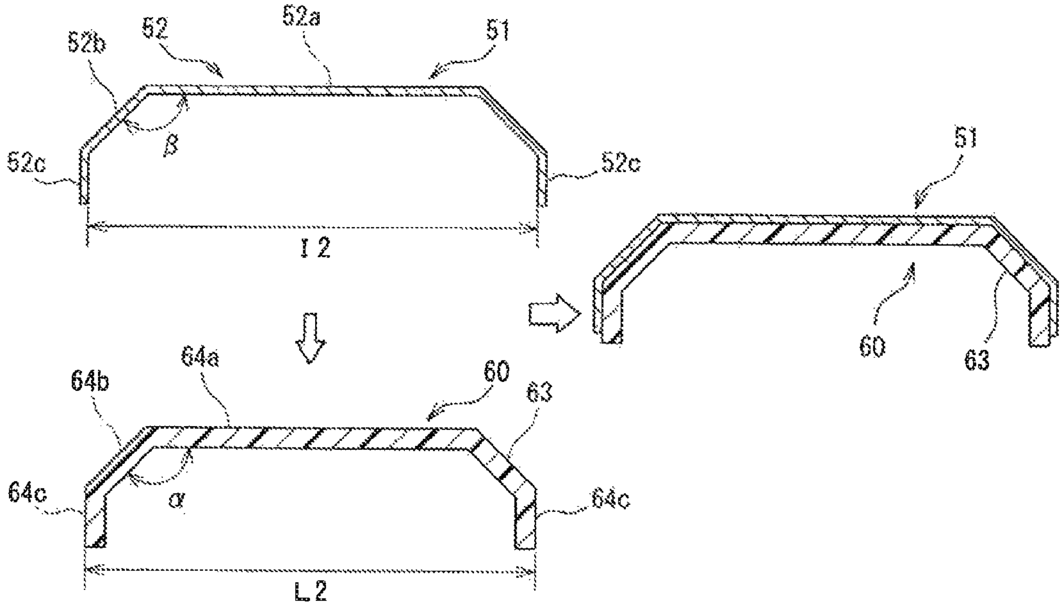
FIG. 32 is a diagram showing an exemplary method for securing an electrical conductive member according to the invention to a chassis having a projection.

Although the electrical conductive member 51 shown in FIG. 32 has the same configuration as the electrical conductive member 1 shown in FIG. 1 or FIG. 18, the electrical conductive member 51 covers a ledge 63 formed on the chassis 60. Additionally, when the electrical conductive member 51 is arranged to cover the ledge 63, its dimensions are set to hold the ledge 63. When the electrical conductive member 51 is arranged to cover the ledge 63 of the chassis 60, the electrical conductive member 51 holds the ledge 63, and the electrical conductive member 51 fits tightly on the ledge 63. The electrical conductive member 51 is thus secured to the chassis 60.

Now, dimensions of the electrical conductive member 51 shown in FIG. 32 will be described.

Firstly, the chassis 60 includes a bottom portion 64*a* and a pair of inclining portions 64*b* extending obliquely downward at the inclination angle α from both ends of the bottom portion 64*a*. The chassis 60 includes a pair of outer wall portions 64*c* extending vertically downward from the tip end of each inclining portion 64*b*. L2 is a width between the external wall surfaces of the pair of outer wall portions 64*c*, which is the width of the chassis 60.

The electrical conductive member 51, on the other hand, includes a base layer 52 having the bottom portion 52*a*, the pair of inclining portions 52*b* extending obliquely downward from the both ends of the bottom portion 52*a* at the inclination angle β, and the pair of outer wall portions 52*c* extending vertically downward from the tip end of each inclining portion 52*b*. I2 is a width between the inner wall surfaces of the pair of outer wall portions 54*c*.

The width I2 between the inner wall surfaces of the pair of outer wall portions 54*c* is set with respect to the width L2 of the chassis 60 to satisfy I2<L2. Dimensions of the electrical conductive member 51 are set to hold the ledge 63, when the electrical conductive member 51 is provided to cover the ledge 63.

It is to be noted that the inclination angle $\alpha$ of each inclining portion 62*b* in the chassis 60 of FIG. 30 may be different from or the same as the inclination angle $\beta$ of each inclining portion 52*b* in the electrical conductive member 51. However, when $\beta<\alpha$ is satisfied, dimensions of the electrical conductive member 51 may be secured with the ledge 63, even if I2>L2 is not satisfied.

Moreover, r<R is satisfied, when the electrical conductive member 51 has the same curved portion with radius of curvature r and the chassis 60 has the same curved section with radius of curvature R as illustrated in FIG. 31, so that the dimensions of the ledge 63 hold the electrical conductive member 51, and when the electrical conductive member 51 is arranged to cover the ledge 63.

Next, referring to FIG. 33, another power-feeding portion of an electrical conductive member according to the invention will be described.

Figure 33:
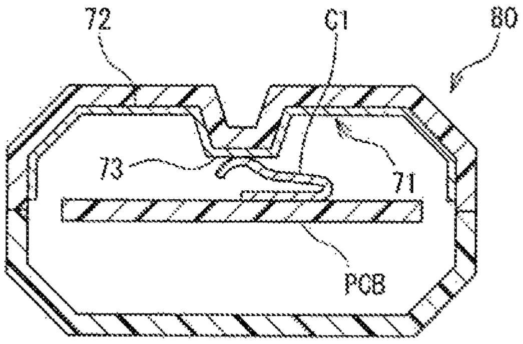
FIG. 33 is a sectional view of a power-feeding portion to the electrical conductive member according to the invention.

An electrical conductive member 71 shown in FIG. 33 has the same basic configuration as the electrical conductive member 1 in FIG. 1 or FIG. 18, except for the power-feeding portion.

That is, the electrical conductive member 71 shown in FIG. 33 includes a power-feeding portion 73 having a protruding portion extending from a base layer 72, and a spring contact C1 makes elastic contact with the protruding portion of the power-feeding portion 73. In a chassis 80, a Printed Circuit Board PCB is supported by a member (not illustrated) and a metal spring contact C1 is connected to the circuit board PCB. Since the spring contact C1 makes elastic contact with the power-feeding portion 73, the Printed Circuit Board PCB is electrically connected with the electrical conductive member 71.

Since the power-feeding portion 73 projects from the base layer 72 towards the Printed Circuit Board PCB, a distance between the Printed Circuit Board PCB and the power-feeding portion 73 can be made shorter than the case where the power-feeding portion 73 is directly located on the inner wall surface of the chassis 80. The height the spring contact C1 (before the spring contact C1 elastically deforms) may thus be made lower, thereby providing stable contact of the spring contact C1 with the power-feeding portion 73. If the height of the spring contact C1 is high, there is a risk that another object may be caught during use, or in that the spring contact is unnecessarily deformed.

Now with reference to FIG. 34, another power-feeding portion of an electrical conductive member according to the invention will be described.

Figure 34:
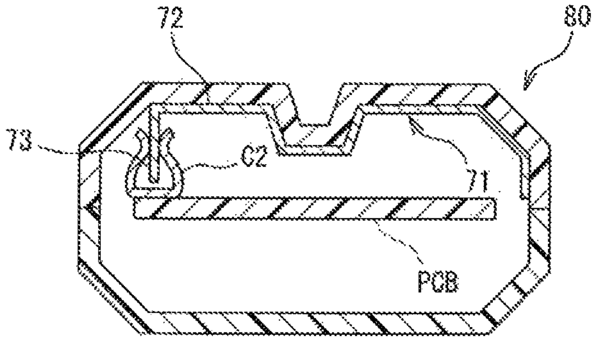
FIG. 34 is a sectional view of another power-feeding portion for the electrical conductive member according to the invention.

An electrical conductive member 71 shown in FIG. 34 has the same basic configuration as the electrical conductive member 1 shown in FIG. 1 or FIG. 18 except for the power-feeding portion.

The electrical conductive member 71 shown in FIG. 34 includes a power-feeding portion 73 that is formed by bending a portion of the base layer 72 (one end part in this example), and an elastic contact C2 makes elastic contact with the power-feeding portion 73 by holding the power-feeding portion 73 from both sides thereof. The power-feeding portion 73 is bent vertically downward with respect to the base layer 72. In the chassis 80, the Printed Circuit Board PCB is supported by a member (not shown) and the metal elastic contact C2 is connected to the Printed Circuit Board PCB. The elastic contact C2 makes elastic contact with the power-feeding portion 73 from both sides thereof, so that the Printed Circuit Board PCB electrically connects with the electrical conductive member 71.

Accordingly, the power-feeding portion 73 has a cantilever shape when the power-feeding portion 73 is bent from a portion of the base layer 72. Therefore, when the elastic contact C2 is brought into contact with one side of the power-feeding portion 73, the power-feeding portion 73 deforms, making it difficult to secure a stable contact. On the other hand, the elastic contact C2 makes elastic contact with the power-feeding portion 73 by holding the power-feeding portion 73 from the both sides thereof to provide a stable contact easily.

Next, with reference to FIG. 35, an electrical conductive member according to the invention with another power-feeding portion will be described.

Figure 35:
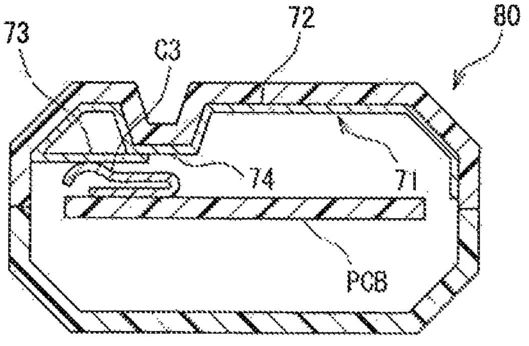
FIG. 35 is a sectional view of another power-feeding portion for the electrical conductive member according to the invention.

The electrical conductive member 71 shown in FIG. 35 has the same basic configuration as the electrical conductive member 1 shown in FIG. 1 or FIG. 18 except for the power-feeding portion.

The electrical conductive member 71, as shown in FIG. 35, includes a power-feeding portion 73 that is formed by folding back a part (i.e. one end part) of a base layer 72. The power-feeding portion 73 is folded back so as to be parallel to the Printed Circuit Board PCB, to be described later. The power-feeding portion 73, in which a part (one end part) of the base layer 72 is folded back, is supported by a support portion 74 provided at another portion of the base layer 72, and in addition, a spring contact C3 makes elastic contact with the power-feeding portion 73 from the opposite side to the side supported by the support portion 74. In the chassis 80, the Printed Circuit Board PCB is supported by a member (not shown), and the metal spring contact C3 is connected to the Printed Circuit Board PCB. The spring contact C3 makes elastic contact with the power-feeding portion 73 to electrically connect the Printed Circuit Board PCB to the electrical conductive member 71.

Since the power-feeding portion 73 is formed by folding back a part (one end part) of the base layer 72 so as to be parallel to the Printed Circuit Board PCB, it is possible to make a wider contact point to be in contact with the spring contact C3 in a direction along the Printed Circuit Board PCB. This makes assembling of the spring contact C3 easier.

Moreover, since the power-feeding portion 73 is supported by the support portion 74 along another portion of the base layer 72, from an opposite side to the side with which the spring contact C3 is brought into contacts, the power-feeding portion 73 is supported at both ends thereof. Therefore, a stable contact can be secured, when the spring contact C3 is brought into contact therewith.

While the embodiments of the present invention have been described so far, the present invention is not limited thereto, and various modifications and improvements thereof are adaptable.

For example, in the electrical conductive member 1, the curved portion 13 should be arranged along the portion of the base layer 10 in which the conductor 20 is arranged, and the first portion 11 or the second portion 12 is not always needed.

Moreover, in the electrical conductive member 1, the conductor 20 is not necessarily provided on the top side or the bottom side of the base layer 10. Rather, the conductor 20 may be embedded in the base layer 10. Moreover, the conductor 20 may be arranged on both sides of the base layer 10 as well as on the top side or the bottom side of the base layer 10. Moreover, the conductor 20 may be arranged on the top side of the base layer 10 or the bottom side thereof, or both sides thereof, to laminate them and from the electrical conductive member 1, so that the conductor 20 may be arranged in the electrical conductive member 1.

Furthermore, while the electrical conductive member 1 is manufactured by vacuum forming, the method for manufacturing the electrical conductive member 1 is not limited thereto.

Moreover, in the electrical conductive member 1, thickness t1 of the curved portion 13 is made thinner than thickness t2 of the portion of the base layer 10 other than curved portion 13. However, the thickness t1 of the curved portion 13 may be made same with or thicker than the thickness t2 of the portion of the base layer 10 excluding the curved portion 13.

Furthermore, in the shown embodiments, an example of using the electrical conductive member 1 used as an antenna device of a mobile phone has been described. However, it is not limited to a mobile phone, when used as an antenna device. The electrical conductive member 1 may be used for a PHS or any other communication device as long as it is used for wireless communications.

Moreover, the electrical conductive member 1 may be used as a sensor or a coil in addition to an antenna device.

Moreover, the method for securing the electrical conductive member 1 to the chassis 30 is not limited to the embodiments described above. For example, a nail or a latch may be provided in the chassis 30, and the electrical conductive member 1 may be secured to the chassis 30 by being latched by the nail or the latch. Moreover, the electrical conductive member 1 may be secured to the chassis 30 using a screw clamp, double-sided tape, an adhesive, or using the technique of soldering.

Additionally, in securing the electrical conductive member 1 to the chassis 30, the chassis 30 may be integrally formed with electrical conductive member 1 by producing the electrical conductive member 1 beforehand, the produced electrical conductive member 1 is placed in a molding dies for molding the chassis 30, and injection-molding the resin. This is the so-called insert-molding.

Moreover, in securing the electrical conductive member 51 to the recess 61 formed in the chassis 60, it is not limited to the cases in which I1>L1, r>R, and β>α, as described above. Rather, the electrical conductive member 51 may have the dimensions such that the electrical conductive member presses the recess 61 outward, when the electrical conductive member 51 is provided in the recess 61.

Moreover, in securing the electrical conductive member 51 to the ledge 63 formed in the chassis 60, it is not limited to the cases where I2<L2, r<R, and β<α. Rather, the electrical conductive member 51 may have the dimensions such that the electrical conductive member 51 is secured on the ledge 63, when the electrical conductive member 51 is arranged to cover the ledge 63.

Further, in connecting the power-feeding portion of the electrical conductive members 1 and 51 to the Printed Circuit Board PCB, the power-feeding portion may be connected to a metal conductor by crimping or by soldering. For example, one end of a cable connected to the Printed Circuit Board PCB may be crimped to a metal barrel (metal conductor), and the power-feeding portion may be connected to the other end of the metal barrel (metal conductor) by soldering. Alternatively, a bus bar (metal conductor) connected to the Printed Circuit Board PCB may be crimped to the power-feeding portion.

What is claimed is:

1. An electrical conductive member comprising:

a base layer having a first portion, a second portion extending at an angle relative to the first portion, and a curved portion connecting the first portion and the second portion; and a conductor arranged on a portion of the base layer wherein the base layer includes a recess disposed at the one end of the first portion and extends from a top side to a bottom side thereof.

2. The electrical conductive member according to claim 1, wherein the conductor is arranged on either a top side, a bottom side, or both sides of the base layer.

3. The electrical conductive member according to claim 1, wherein a thickness of the curved portion is thinner than a rest of the base layer.

4. The electrical conductive member according to claim 3, wherein the thickness of the curved portion is thinner than a thickness of the first portion and a thickness of the second portion.

5. The electrical conductive member according to claim 4, wherein the curved portion is thinner than a thickness of the first portion, a thickness of the second portion, and a thickness of an extending portion projecting from the first portion, the second portion and the curved portion.

6. The electrical conductive member according to claim 1, wherein the base layer includes an extending portion projecting inward from upper ends of the first portion, the second portion, and the curved portion.

7. The electrical conductive member according to claim 1, wherein the second portion extends substantially orthogonal to the first portion.

8. The electrical conductive member according to claim 1, further comprising a power-feeding portion disposed along the conductor.

9. The electrical conductive member according to claim 8, wherein the power-feeding portion is formed by folding an end of the conductor arranged on a bottom side of the base layer.

10. The electrical conductive member according to claim 8, wherein the power-feeding portion is formed with a protruding portion projecting from the base layer.

11. The electrical conductive member according to claim 8, wherein the power-feeding portion is formed by bending an end of the base layer back to a support portion along another portion of the base layer.

12. The electrical conductive member according to claim 1, wherein the conductor is positioned on a top side of the base layer and includes a first conductive portion, a second conductive portion, and a third conductive portion.

13. The electrical conductive member according to claim 12, wherein the first conductive portion includes a planate electrical conductive pattern extending towards one end of the first portion from another other end thereof.

14. The electrical conductive member according to claim 13, wherein the second conductive portion includes a planate electrical conductive pattern extending towards one end the second portion from another other end thereof.

15. The electrical conductive member according to claim 14, wherein the third conductive portion includes a planate electrical conductive pattern connecting the first conductive portion to the second conductive portion and disposed on the curved portion.

16. The electrical conductive member according to claim 15, wherein the third conductive portion is trice folded over.

17. The electrical conductive member according to claim 15, further comprising a power-feeding portion disposed at one end portion of the first conductive portion.

18. The electrical conductive member according to claim 17, further comprising another power-feeding portion disposed at one end portion of the second conductive portion.

19. The electrical conductive member according to claim 1, wherein a power-feeding portion is formed by bending the first conductive portion towards the recess and then folding back the first conductive portion by 180 degrees from an end of the top side thereof to the bottom side.

20. The electrical conductive member according to claim 19, wherein the base layer includes another recess disposed at one end of the second portion and extends from a top side to a bottom side thereof.

21. The electrical conductive member according to claim 20, further comprising another power-feeding portion disposed at the one end portion of the second conductive portion and formed by bending the first conductive portion towards the recess and then folding back the first conductive portion by 180 degrees from the end of the top side thereof to the bottom side.

22. An electrical conductive member comprising:

a base layer having a first portion connecting the first portion extending at an angle relative to the first portion, and a carved portion connecting the first portion and the second portion;

a conductor arranged on a portion of the base layer, and an extending portion projecting from upper ends of the first portion and the second portion with a projection receiving passageway disposed at one end of the extending portion and another projection receiving passageway at another end of the extending portion.

23. The electrical conductive member according to claim 22, wherein the base layer includes a recess disposed at the one end of the first portion and extends from a top side to a bottom side thereof.

24. The electrical conductive member according to claim 23, wherein the base layer includes another recess disposed at one end of the second portion and extends from a top side to a bottom side thereof.

25. The electrical conductive member according to claim 24, further comprising a surface projection receiving passageway formed in each recess.

26. An electrical conductive member comprising:

a base layer having a first portion, a second portion extending at an angle relative to the first portion, and a curved portion connecting the first portion and the second portion; and a conductor arranged on a portion of the base layer wherein the base layer includes a straddling portion having a shape to straddle a projection disposed on an assembled component.

27. The electrical conductive member according to claim 26, wherein the conductor is an antenna device, a sensor, or a coil.

28. The electrical conductive member assembly according to claim 26, wherein a chassis further includes a projection disposed on a stand.

29. An electrical conductive member assembly comprising:

a chassis having a curved section connecting side wall portions, a stand extending from an inner surface of the chassis and a projection disposed on the stand; and the electrical conductive member having a base layer with a first portion, a second portion extending at an angle relative to the first portion, and a curved portion connecting the first portion and the second portion, the curved portion corresponding with the curved section of the chassis;

wherein the base layer includes a recess disposed at the one end of the first portion and extends from a top side to a bottom side thereof and includes a projection receiving passageway.

30. The electrical conductive member according to claim 29, wherein the recess is seated on the stand and the projection corresponds with the projection receiving passageway.

31. The electrical conductive member according to claim 30, further comprising an extending portion extends from an upper end of the first portion with a surface projection receiving passageway disposed at one end thereof.

32. The electrical conductive member according to claim 31, wherein the chassis includes a surface projection disposed on a flat surface portion of the chassis and corresponding with the surface projection receiving passageway disposed along the extending portion.

33. An electrical conductive member assembly comprising:

a chassis having a curved section connecting side wall portions, a stand extending from an inner surface of the chassis and a projection disposed on the stand; and the electrical conductive member having a base layer with a first portion, a second portion extending at an angle relative to the first portion, and a curved portion connecting the first portion and the second portion, the curved portion corresponding with the curved section of the chassis wherein the base layer abuts a side surface of the projection.

34. The electrical conductive member according to claim 33, further comprising a cavity formed in the stand.

35. The electrical conductive member assembly according to claim 34, wherein the base layer includes a projection portion that corresponds to the cavity of the stand.

36. An electrical conductive member assembly comprising: a chassis having a curved section connecting side wall portions; and electrical conductive member having a base layer with a first portion, a second portion extending at an angle relative to the first portion, and a curved portion connecting the portion and the second portion, the curved portion corresponding with the curved section of the chassis, wherein the second portion extends substantially orthogonal to the first portion.

37. An electrical conductive member assembly comprising:

an electrical conductive member having:

a base layer; and a conductor positioned of the base layer and including a first conductive portion, a second conductive portion, and a third conductive portion connected to the first conductive portion and the second conductive portion and disposed along the base layer; and an assembled component in which the electrical conductive member is arranged wherein the electrical conductive member is arranged to enter a recess formed in the assembled component and presses the recess outward when the electrical conductive member is arranged within the recess.

38. The electrical conductive member according to claim 37, wherein the base layer includes a curved portion.

39. The electrical conductive member according to claim 38, wherein the third conductive portion includes a planate electrical conductive pattern connecting the first conductive portion to the second conductive portion and positioned on a surface of the curved portion.

40. An electrical conductive member assembly comprising:

an electrical conductive member having:

a base layer; and a conductor positioned on a portion of the base layer and including a first conductive portion, a second conductive portion, and a third conductive portion connected to the first conductive portion and the second conductive portion and disposed along the base layer; and an assembled component in which the electrical conductive member is arranged wherein the electrical conductive member covers a projection formed along the assembled component when the electrical conductive member is arranged to cover the projection.

* * * * *